(12) United States Patent  (10) Patent No.: US 7,786,485 B2
Dairiki et al.  (45) Date of Patent: Aug. 31, 2010

(54) THIN-FILM TRANSISTOR AND DISPLAY DEVICE

(75) Inventors: Koji Dairiki, Kanagawa (JP); Hidekazu Miyairi, Kanagawa (JP); Yoshiyuki Kurokawa, Kanagawa (JP); Shunpei Yamazaki, Tokyo (JP); Hiromichi Godo, Kanagawa (JP); Daisuke Kawae, Kanagawa (JP); Satoshi Kobayashi, Kanagawa (JP)

(73) Assignee: Semicondutor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/390,144

(22) Filed: Feb. 20, 2009

(65) Prior Publication Data

US 2009/0218576 A1  Sep. 3, 2009

(30) Foreign Application Priority Data

Feb. 29, 2008 (JP) ............................. 2008-051426

(51) Int. Cl.
H01L 27/14 (2006.01)
H01L 29/04 (2006.01)
H01L 29/15 (2006.01)

(52) U.S. Cl. .................... 257/72; 257/59; 257/E29.273
(58) Field of Classification Search ........................ None
See application file for complete search history.

(56) References Cited

U.S. PATENT DOCUMENTS 4,409,134 A  10/1983  Yamazaki et al.
5,101,242 A  3/1992  Ikeda et al.
5,221,631 A  6/1993  Ikeda et al.
5,473,168 A * 12/1995  Kawai et al. .................. 257/61
6,153,893 A  11/2000  Inoue et al.
2001/0014493 A1  8/2001  Inoue et al.
2005/0115930 A1  6/2005  Tanaka et al.

FOREIGN PATENT DOCUMENTS

| EP | 0 535 979 A2 | 4/1993 |
| JP | 2-218166 | 8/1990 |
| JP | 5-129608 | 5/1993 |
| JP | 7-131030 | 5/1995 |
| JP | 07-047876 | 11/1995 |
| JP | 2001-053283 | 2/2001 |
| JP | 2005-049832 | 2/2005 |
| JP | 2005-191546 | 7/2005 |

* cited by examiner

*Primary Examiner*—W. David Coleman
*Assistant Examiner*—Shaka Scarlett
(74) *Attorney, Agent, or Firm*—Nixon Peabody LLP; Jeffrey L. Costellia

(57) ABSTRACT

A thin-film transistor includes a pair of impurity semiconductor layers in which an impurity element imparting one conductivity type is added to form a source and drain regions so as to be overlapped at least partly with a gate electrode with a gate insulating layer interposed between the gate electrode and the impurity semiconductor layers; a pair of conductive layers which is overlapped over the gate insulating layers at least partly with the gate electrode and the impurity semiconductor layers, and is disposed with a space therebetween in a channel length direction; and an amorphous semiconductor layer which is in contact with the gate insulating layer and the pair of conductive layers and is extended between the pair of conductive layers.

25 Claims, 25 Drawing Sheets

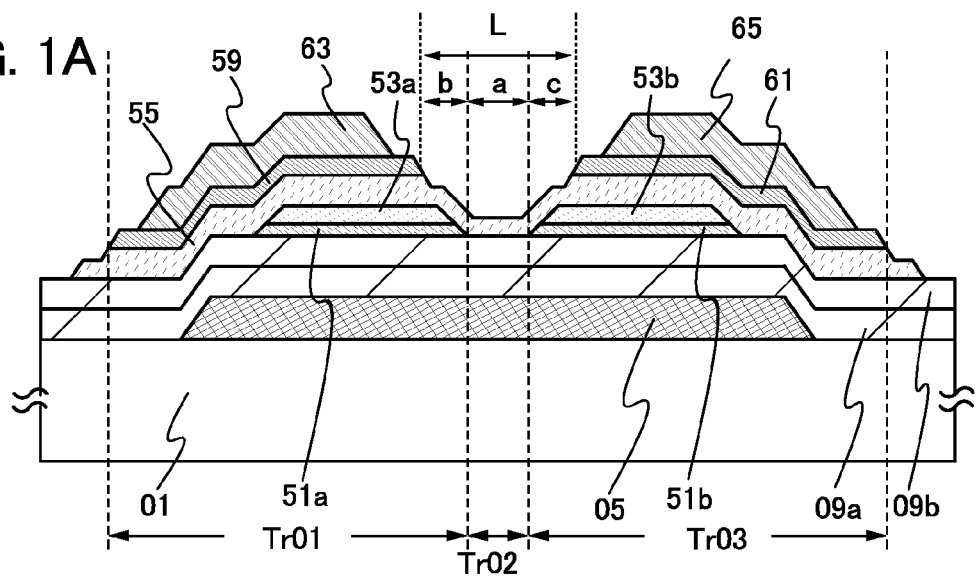
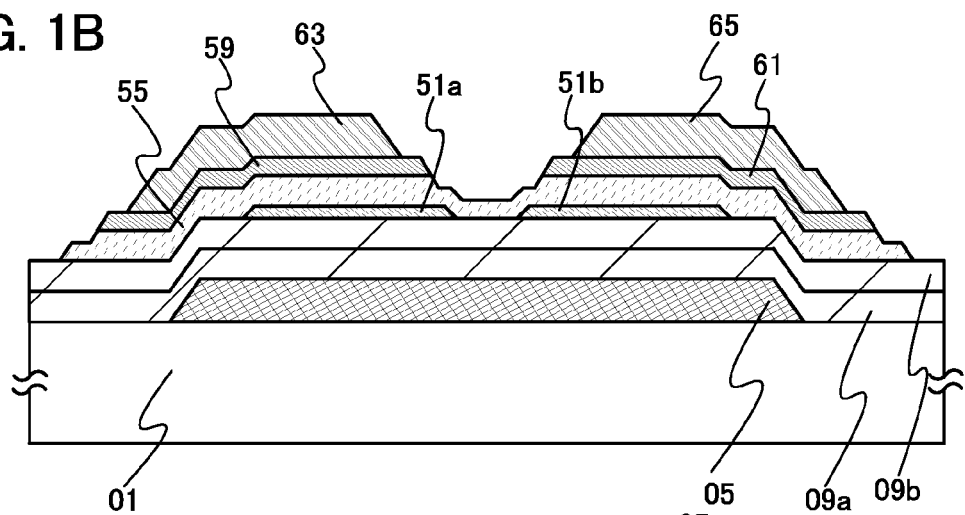
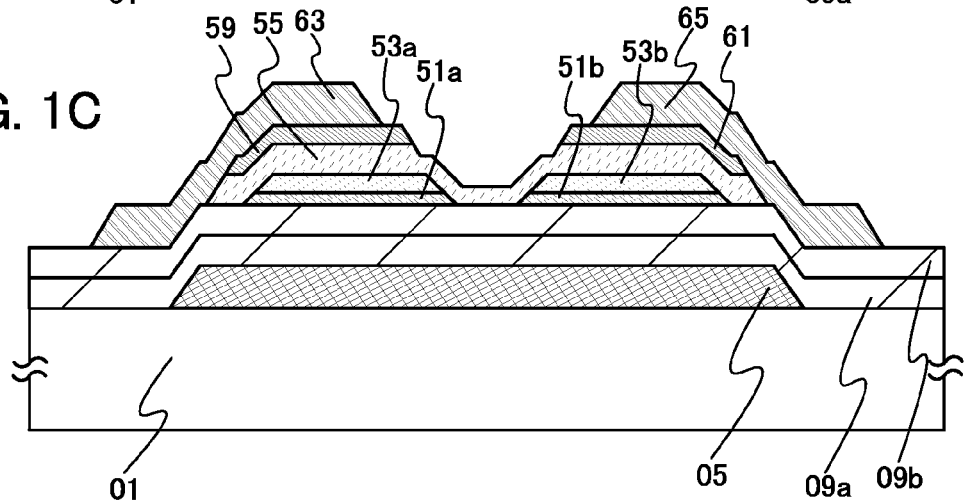

THIN-FILM TRANSISTOR AND DISPLAY DEVICE

BACKGROUND OF THE INVENTION

1. Field of the Invention

The present invention relates to a thin-film transistor and a display device which is operated using the thin-film transistor.

2. Description of the Related Art

As a kind of field-effect transistor, a thin-film transistor in which a channel region is formed in a semiconductor layer formed over a substrate having an insulating surface is known. Techniques in which amorphous silicon, microcrystalline silicon, or polycrystalline silicon is used for the semiconductor layer used in the thin-film transistor have been disclosed (see Patent Documents 1 to 5). A typical application of a thin-film transistor is a liquid crystal television in which the thin-film transistor has been put to the practical use as a switching transistor for each pixel included in a display panel.

[Patent Document 1] Japanese Published Patent Application No. 2001-053283

[Patent Document 2] Japanese Published Patent Application No. Hei05-129608

[Patent Document 3] Japanese Published Patent Application No. 2005-049832

[Patent Document 4] Japanese Published Patent Application No. Hei07-131030

[Patent Document 5] Japanese Published Patent Application No. 2005-191546

SUMMARY OF THE INVENTION

The thin-film transistor in which the channel is formed in an amorphous silicon layer has a problem in that the field-effect mobility is only about 0.4 to 0.8 $cm^2/V \cdot sec$ and the on-state current is low. On the other hand, the thin-film transistor in which the channel is formed in a microcrystalline silicon layer has a problem in that, whereas the field-effect mobility is higher than that of the thin-film transistor using amorphous silicon, the off-state current is high, so that sufficient switching characteristics cannot be obtained.

The thin-film transistor in which a polycrystalline silicon layer is used for the channel formation region has characteristics in that the field-effect mobility is far higher than those of the above-described two kinds of thin-film transistors and large on-state current can be obtained. According to the above-described characteristics, this thin-film transistor can be used not only as a switching thin-film transistor in each pixel but also for a driver circuit which needs to operate at high speed.

However, the thin-film transistor in which a polycrystalline silicon layer is used for the channel formation region has a problem in that the manufacturing cost becomes higher than that of the thin-film transistor using an amorphous silicon layer by a step of crystallizing a semiconductor layer. For example, with laser annealing technique involved in the process for manufacturing a polycrystalline silicon layer, large liquid crystal panels cannot be produced efficiently because the irradiated area with the laser beam is small.

A mother glass for manufacturing display panels has been grown in size from year to year as follows: 3rd generation (550 mm×650 mm), 3.5th generation (600 mm×720 mm or 620 mm×750 mm), 4th generation (680×880 mm or 730 mm×920 mm), 5th generation (1100 mm×1300 mm), 6th generation (1500 mm×1850 mm), 7th generation (1870 mm×2200 mm), and 8th generation (2200 mm×2400 mm). From now on, the size of mother glasses is expected to grow to 9th generation (2400 mm×2800 mm or 2450 mm×3050 mm) and 10th generation (2950 mm×3400 mm). Increase in size of mother glasses is based on the minimum-cost design concept.

However, the technique that thin-film transistors capable of high-speed operation can be manufactured over a large-area mother glass such as a 10th generation (2950 mm×3400 mm) mother glass with high production has not been established yet, which is a problem in industry.

In view of the foregoing, it is an object of the present invention to solve the above-described problems with on-state current and off-state current of thin-film transistors. It is another object of the present invention to provide a thin-film transistor capable of high-speed operation.

A thin-film transistor according to one embodiment of the present invention includes a pair of impurity semiconductor layers in which an impurity element imparting one conductivity type is added to form a source and drain regions which are overlapped at least partly with a gate electrode with a gate insulating layer interposed between the gate electrode and the pair of impurity semiconductor layers; and a pair of conductive layers which is overlapped over the gate insulating layer, at least partly with the gate electrode and the pair of impurity semiconductor layers, and is disposed in a channel length direction. Moreover, an amorphous semiconductor layer is included, which is in contact with the gate insulating layer and the pair of conductive layers and is extended between the pair of conductive layers.

A thin-film transistor according to one embodiment of the present invention includes a gate insulating layer covering a gate electrode; an amorphous semiconductor layer provided over the gate insulating layer; and a pair of impurity semiconductor layers in which an impurity element imparting one conductivity type is added to form a source and drain regions. Moreover, a pair of conductive layers which is provided between the gate insulating layer and the amorphous semiconductor layer, overlapped at least partly with the pair of impurity semiconductor layers, and is disposed with a space between the source region and the drain region is included.

A thin-film transistor according to one embodiment of the present invention includes a pair of conductive layers which is overlapped with a gate electrode with a gate insulating layer interposed therebetween; an amorphous semiconductor layer covering the pair of conductive layers; and a pair of impurity semiconductor layers over the amorphous semiconductor layer, in which an impurity element imparting one conductivity type is added to form a source and drain regions. The amorphous semiconductor layer is provided to extend between the pair of conductive layers.

In the thin-film transistor, carriers (electrons and holes) flowing between the source region and the drain region, which are controlled by a voltage applied to the gate electrode, flow through the conductive layers overlapped with the gate electrode and the amorphous semiconductor layer which is provided to extend in the channel length direction and over the conductive layers.

Note that the conductive layers do not extend all over the region in the channel length direction of the thin-film transistor, but are provided with a space between the conductive layers. That is, in this thin-film transistor, carriers flowing in the channel flow through the amorphous semiconductor layer at a certain distance in the channel length direction between the source region and the drain region.

The electrical conductivity of the amorphous semiconductor layer is lower than that of the microcrystalline semiconductor layer. The donor concentration of the microcrystalline semiconductor layer is equal to or greater than $5\times10^{18}$ atoms/$cm^3$ and equal to or less than $2\times10^{20}$ atoms/$cm^3$. The pair of conductive layers, which extends at least in the channel length direction of the thin-film transistor and has the above-described electrical conductivity, has a function of improving on-state current. On the other hand, the amorphous semiconductor layer, which extends over the channel formation region and forms a so-called off-set region, has a function of reducing off-state current.

The impurity semiconductor means a semiconductor in which most of carriers contributing to electrical conduction is supplied from the added impurity element into the semiconductor. The impurity element is an element capable of being a donor that supplies an electron as a carrier or an element capable of being an acceptor that supplies a hole as a carrier; typically, the donor is a Group 15 element in the periodic table and the acceptor is a Group 13 element in the periodic table.

The microcrystalline semiconductor means a semiconductor, for example, in which the crystal grain size is equal to or greater than 2 nm and equal to or less than 200 nm, or equal to or greater than 10 nm and equal to or less than 80 nm, or equal to or greater than 20 nm and equal to or less than 50 nm, and the electrical conductivity, about $10^{-7}$ to $10^{-4}$ S/cm, can be increased to about $10^1$ S/cm by valence electron control. The definition of the microcrystalline semiconductor is not fixed at only the above-described crystal grain size and electrical conductivity; the microcrystalline semiconductor can be replaced with any other semiconductor material having a property value equivalent to the above value. The amorphous semiconductor means a semiconductor which does not have a crystal structure (long-range order in the atomic arrangement). Here, amorphous silicon as the amorphous semiconductor may include hydrogen.

The "on-state current" means current flowing through the channel formation region when an appropriate gate voltage is applied to the gate electrode such that current flows through the channel formation region (that is, when the thin-film transistor is on). The "off-state current" means current flowing between the source and the drain when the gate voltage is lower than the threshold voltage of the thin-film transistor (that is, when the thin-film transistor is off).

The conductive layers do not extend all over the region in the channel length direction, but are provided with a space between the conductive layers such that carriers flowing in the channel flow through the amorphous semiconductor layer at a certain distance in the channel length direction between the source region and the drain region. Accordingly, large on-state current can be obtained whereas off-state current can be reduced.

In the thin-film transistor, the field-effect mobility can be increased by increasing the donor concentration in the microcrystalline semiconductor layer and the operation of the thin film transistor can be performed at high speed.

BRIEF DESCRIPTION OF THE DRAWINGS

FIGS. 1A to 1C are cross-sectional views each describing a thin-film transistor according to an embodiment of the present invention.

DETAILED DESCRIPTION OF THE INVENTION

Figure 2:
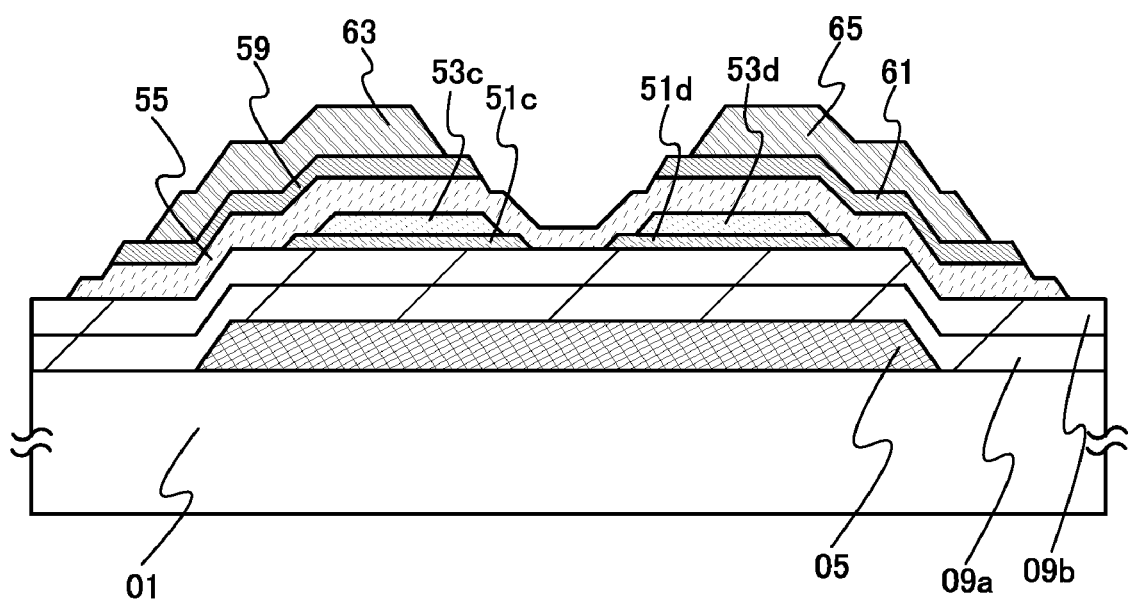
FIG. 2 is a cross-sectional view describing a thin-film transistor according to an embodiment of the present invention.

Hereinafter, the embodiments and example of the present invention will be described using the accompanying drawings. The present invention is not limited to the following description, and it is easily understood by those skilled in the art that the mode and detail of the present invention can be variously changed without departing from the spirit and scope thereof. Therefore, the present invention is not construed as being limited to the description of the following embodiments and example. In the structures of the present invention described hereinafter, reference symbols are used in common in the drawings.

In the description on the following embodiments, a gate electrode 05 is part of a gate wiring; hence, the gate electrode 05 is described as a gate wiring 05 in some cases. Similarly, a wiring 63 is described as a source wiring 63 or a source electrode 63 in some cases.

Embodiment 1

In this embodiment, structures of the thin-film transistor will be described using FIGS. 1A to 1C, in which the off-state current is lower as compared to the thin-film transistor including a microcrystalline semiconductor layer for the channel formation region and operation at higher speed can be performed and the on-state current is higher as compared to the thin-film transistor including an amorphous semiconductor layer for the channel formation region.

In a thin-film transistor shown in FIG. 1A, a gate electrode 05 is formed over a substrate 01, gate insulating layers 09a and 09b are formed over the gate electrode 05, conductive layers 51a and 51b which are provided with a space therebetween are formed over the gate insulating layer 09b, and buffer layers 53a and 53b which are provided with a space therebetween are formed over the conductive layers 51a and 51b. The buffer layers 53a and 53b are about overlapped with the conductive layers 51a and 51b. Further, an amorphous semiconductor layer 55 which covers the side surfaces of the conductive layers 51a and 51b and the buffer layers 53a and 53b and the top surfaces of the buffer layers 53a and 53b is formed. A pair of impurity semiconductor layers 59 and 61 in which an impurity element imparting one conductivity type is added to form a source and drain regions is formed over the amorphous semiconductor layer 55, and wirings 63 and 65 are formed over the impurity semiconductor layers 59 and 61 in which the impurity element imparting one conductivity type is added.

The conductive layers 51a and 51b are formed using a conductive layer having an electrical conductivity of 0.9 to 2 Scm$^{-1}$. As examples of each of the conductive layers 51a and 51b, there are a metal layer, a metal nitride layer, a metal carbide layer, a metal boride layer, a metal silicide layer, a semiconductor layer in which an impurity element serving as a donor is added, and the like which satisfy the above-described electrical conductivity.

As the metal layer, typically, a metal layer of aluminum, copper, titanium, neodymium, scandium, molybdenum, tantalum, tungsten, cobalt, nickel, silver, gold, platinum, tin, iridium, or the like, or a metal alloy layer made of a plurality of them can be used as appropriate. A singe layer of the above-described metal layer or the metal alloy layer or a stack layer thereof can be used.

As the metal nitride layer, the following can be used: a titanium nitride layer, a zirconium nitride layer, a hafnium nitride layer, a tantalum nitride layer, a vanadium nitride layer, a niobium nitride layer, a chromium nitride layer, a lanthanum nitride layer, an yttrium nitride layer, or the like. A singe layer of the above-described metal nitride layer or a stack layer thereof can be used.

As the metal carbide layer, the following can be used: a titanium carbide layer, a hafnium carbide layer, a niobium carbide layer, a tantalum carbide layer, a vanadium carbide layer, a zirconium carbide layer, a chromium carbide layer, a cobalt carbide layer, a molybdenum carbide layer, a tungsten carbide layer, or the like. A singe layer of the above-described metal carbide layer or a stack layer thereof can be used.

As the metal boride layer, a titanium boride layer can be used.

As the metal silicide layer, the following can be used: a platinum silicon layer, a titanium silicon layer a molybdenum silicon layer, a nickel silicon layer, a chromium silicon layer, a cobalt silicon layer, a vanadium silicon layer, a tungsten silicon layer, a zirconium silicon layer, a hafnium silicon layer, a niobium silicon layer, a tantalum silicon layer, or the like. A singe layer of the above-described metal silicide layer or a stack layer thereof can be used.

The conductive layers 51a and 51b each can have a stack structure using plural kinds of layers selected from the metal layer, the metal nitride layer, the metal carbide layer, the metal boride layer, and the metal silicide layer.

Figure 28A:
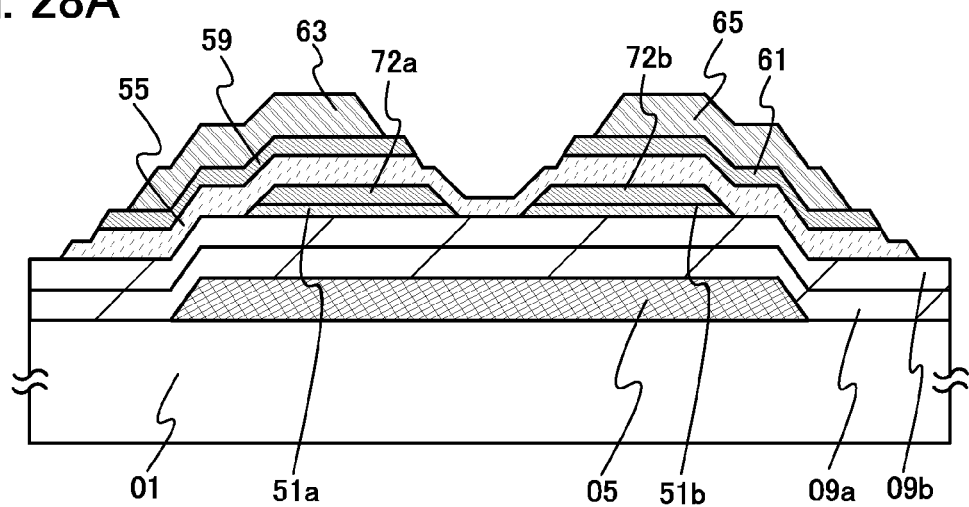
FIGS. 28A to 28C are cross-sectional views each describing the thin-film transistor according to the embodiment of the present invention.
Figure 28B:
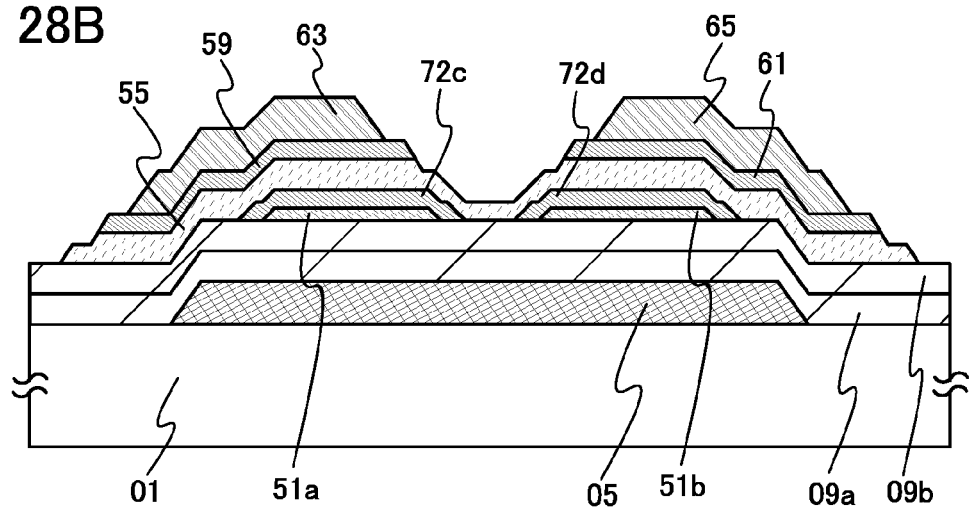
Figure 28C:
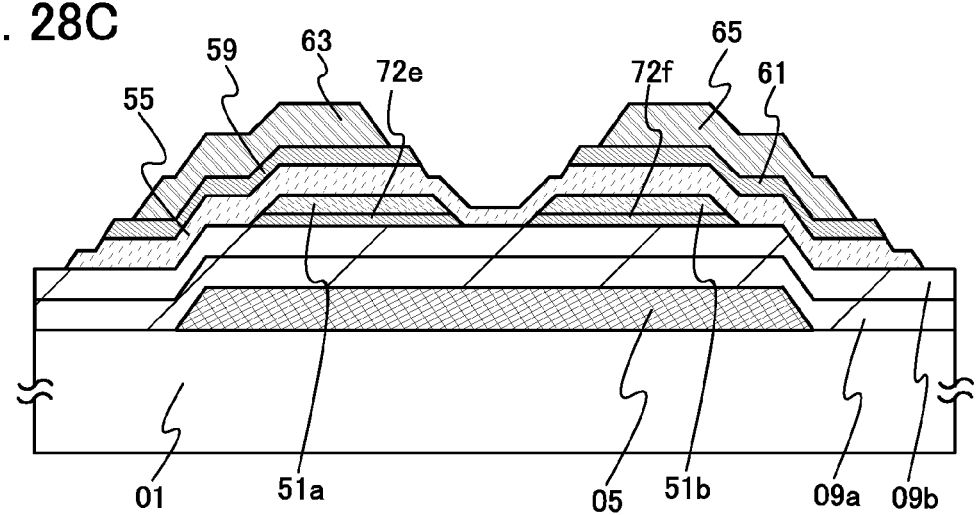

Note that when plural kinds of layers selected from the metal layer, the metal nitride layer, the metal carbide layer, the metal boride layer, and the metal silicide layer are formed as each of the conductive layers 51a and 51b, in order to form an ohmic contact between the amorphous semiconductor layer 55 and the conductive layers 51a and 51b, semiconductor layers 72a and 72b in which an impurity element serving as a donor or an acceptor is added each may be formed over any of the plural kinds of layers selected from the metal layer, the metal nitride layer, the metal carbide layer, the metal boride layer, and the metal silicide layer (see FIG. 28A). Alternatively, semiconductor layers 72c and 72d in which an impurity element serving as a donor or an acceptor is added may cover the top and side surfaces of the metal layer, the metal nitride layer, the metal carbide layer, the metal boride layer, the metal silicide layer, or the like (see FIG. 28B). Further alternatively, semiconductor layers 72e and 72f in which an impurity element serving as a donor or an acceptor is added may be formed over the gate insulating layer 09b, and over the semiconductor layers 72e and 72f, a metal layer, a metal nitride layer, a metal carbide layer, a metal boride layer, a metal silicide layer, or the like may be formed (see FIG. 28C). With such a structure, Schottky junction at the interface between the amorphous semiconductor layer and the metal layer, the metal nitride layer, the metal carbide layer, the metal boride layer, the metal silicide layer, or the like can be changed into ohmic contact so that characteristics of a thin-film transistor are improved.

An impurity element serving as a donor which supplies an electron as a carrier is added into the impurity semiconductor layers. As the impurity element serving as a donor, a Group 15 element in the periodic table such as phosphorus, arsenic, or antimony is typically given. As each of the semiconductor layers in which the impurity element serving as a donor is added, an amorphous silicon layer, an amorphous silicon germanium layer, an amorphous germanium layer, a microcrystalline silicon layer, a microcrystalline silicon germanium layer, a microcrystalline germanium layer, a polycrystalline silicon layer, a polycrystalline silicon germanium layer, a polycrystalline germanium layer, or the like is used. When an amorphous germanium layer or a microcrystalline germanium layer is used as each of the semiconductor layers, the resistivity is small, so that the impurity element serving as a donor is not necessarily added.

When the concentration of the impurity element serving as a donor added into the semiconductor layers is measured by secondary ion mass spectroscopy (SIMS) and estimated to be equal to or greater than $5 \times 10^{18}$ atmos/cm$^3$ and equal to or less than $2 \times 10^{20}$ atmos/cm$^3$, the resistance at the interface between the gate insulating layer 09b and the semiconductor layers in which the impurity element serving as a donor is added can be reduced and a thin-film transistor capable of high-speed operation with large on-state current can be manufactured.

The microcrystalline semiconductor in this specification is defined as a semiconductor having an intermediate structure between an amorphous structure and a crystalline structure (including a single crystal structure and a polycrystalline structure). This semiconductor is a semiconductor having the third state that is stable in terms of free energy and is a crystalline substance having a short-range order and lattice distortion, and has column-like or needle-like crystals with a grain size which is equal to or greater than 2 nm and equal to or less than 200 nm, or equal to or greater than 10 nm and equal to or less than 80 nm, or equal to or greater than 20 nm and equal to or less than 50 nm, grown in the direction of a normal line with respect to the surface of a substrate. The microcrystalline semiconductor also means a semiconductor the electrical conductivity thereof, which is about $10^{-7}$ S/cm to $10^{-4}$ S/cm, can be increased to about $10^1$ S/cm by valence electron control. Further, a non-single-crystal semiconductor exists between a plurality of microcrystalline semiconductors. A peak of Raman spectrum of microcrystalline silicon, which is a typical example of a microcrystalline semiconductor, is shown in lower wave numbers than 520 cm$^{-1}$ which represents a peak of the Raman spectrum of single crystal silicon, that is, the peak of the Raman spectrum of microcrystalline silicon is shown between 520 cm$^{-1}$ and 480 cm$^{-1}$ which represent single crystal silicon and amorphous silicon, respectively. The microcrystalline semiconductor may include hydrogen or halogen at least 1 at. % to terminate a dangling bond. Moreover, microcrystalline silicon may contain a rare gas element such as helium, argon, krypton, or neon. Accordingly, the lattice distortion is promoted, and the stability of structure of the microcrystalline silicon is increased, and a favorable microcrystalline semiconductor can be obtained. Such a microcrystalline semiconductor is disclosed in, for example, U.S. Pat. No. 4,409,134. The definition of the microcrystalline semiconductor is not fixed at only the above-described grain size and electrical conductivity; the microcrystalline semiconductor can be replaced with any other semiconductor material having a property value equivalent to the above value.

The conductive layers 51a and 51b are each formed with a thickness equal to or greater than 5 nm and equal to or less than 50 nm, preferably equal to or greater than 5 nm and equal to or less than 30 nm.

In the case where the conductive layers 51a and 51b each are a semiconductor layer in which the impurity element serving as a donor is added, it is preferable that the concentrations of oxygen and nitrogen each be less than 10 times that of the impurity element serving as a donor, typically less than $3 \times 10^{19}$ atoms/cm$^3$, more preferably less than $3 \times 10^{18}$ atoms/cm$^3$; and that the concentration of carbon be equal to or less than $3 \times 10^{18}$ atoms/cm$^3$. When the semiconductor layers are microcrystalline semiconductor layers, generation of defects in the microcrystalline semiconductor layers can be suppressed by reducing the concentration of oxygen, nitrogen, and carbon in the microcrystalline semiconductor layers. Furthermore, oxygen and nitrogen in the microcrystalline semiconductor layer prevent the microcrystalline semiconductor layers from crystallizing. Therefore, when the semiconductor layers in which the impurity element serving as a donor is added are microcrystalline semiconductor layers, crystallinity of the microcrystalline semiconductor layers can be improved by reducing the concentration of oxygen and nitrogen in the microcrystalline semiconductor layers as much as possible and by adding the impurity element serving as a donor.

In the case where the conductive layers 51a and 51b each are a semiconductor layer in which the impurity element serving as a donor is added, an impurity element serving as an acceptor may be added at the same time as or after the deposition of the semiconductor layers, so that the threshold voltage can be controlled A typical example of the impurity element serving as an acceptor is boron, and an impurity gas of $B_2H_6$ or $BF_3$ is preferably mixed into silicon hydride at 1 to 1000 ppm, preferably 1 to 100 ppm. The concentration of boron is preferably set to be about one tenth that of the impurity element serving as a donor, e.g., $1 \times 10^{14}$ to $6 \times 10^{16}$ atoms/cm$^3$.

The buffer layers 53a and 53b are each formed using an amorphous semiconductor layer in which halogen such as fluorine or chlorine may be added. The buffer layers 53a and 53b are each formed with a thickness of 30 to 200 nm, preferably 50 to 150 nm. As examples of the amorphous semiconductor layer, there are an amorphous silicon layer, an amorphous silicon layer including germanium, and the like.

By inclining the side surfaces of the buffer layers 53a and 53b at angles of 30° to 60° to the bottom surface, when the conductive layers 51a and 51b are microcrystalline semiconductor layers, the crystallinity of the interface between each of the microcrystalline semiconductor layers and the amorphous semiconductor layer 55 which is in contact with the microcrystalline semiconductor layer can be improved using the microcrystalline semiconductor layers as crystal growth seeds, leading to high-speed operation of a thin-film transistor and increase in on-state current.

When the conductive layers 51a and 51b are microcrystalline semiconductor layers, the buffer layers 53a and 53b are each formed using an amorphous semiconductor layer or an amorphous semiconductor layer including hydrogen, nitrogen, or halogen, thereby preventing native oxidation of the surface of each crystal grain in the semiconductor layer in which the impurity element serving as a donor is added. In particular, in a region where an amorphous semiconductor is in contact with microcrystal grains, a crack is likely to be caused due to local stress in the microcrystalline semiconductor layer. When a crack is exposed to oxygen, the crystal grains are oxidized, so that silicon oxide is formed on the crystal grains. However, the oxidation of microcrystal grains can be prevented by forming the buffer layers 53a and 53b on the surfaces of the semiconductor layers in which the impurity element serving as a donor is added. Therefore, generation of defects by which carriers are trapped or a region where the travel of carriers is prevented can be decreased, so that high-speed operation of the thin-film transistor can be realized and on-state current can be increased.

As examples of the amorphous semiconductor layer 55, there are an amorphous silicon layer, an amorphous silicon layer including germanium, and the like. The amorphous semiconductor layer 55 may include fluorine, chlorine, or the like. When the semiconductor layer in which the impurity element serving as a donor is added is formed as each of the conductive layers 51a and 51b, an amorphous semiconductor layer in which phosphorus is added at a lower concentration than the impurity element serving as a donor in the semiconductor layer may be used as the amorphous semiconductor layer 55. The thickness of part of the amorphous semiconductor layer 55, which is overlapped with a wiring, is equal to or greater than 50 nm and less than 500 nm.

The amorphous semiconductor layer 55 covers the side surfaces of the conductive layers 51a and 51b and the buffer layers 53a and 53b. In the peripheries of the conductive layers 51a and 51b, the gate insulating layer 09b is in contact with the amorphous semiconductor layer 55. With this structure, the conductive layers 51a and 51b are isolated from the pair of impurity semiconductor layers 59 and 61 in which the impurity element imparting one conductivity type is added, so that leakage current generated between them can be reduced. It is preferable that the amorphous semiconductor layer 55 cover the buffer layers 53a and 53b. The amorphous semiconductor layer 55 covering the buffer layers 53a and 53b prevents the pair of impurity semiconductor layers 59 and 61 in which the impurity element imparting one conductivity type is added from being in direct contact with the buffer layers 53a and 53b, so that leakage current can be reduced.

When the gate insulating layer 09b is a silicon oxide layer or a silicon nitride layer and the semiconductor layer in which the impurity element serving as a donor is added is used as each of the conductive layers 51a and 51b, an amorphous semiconductor layer in which phosphorus is added at a lower concentration than the impurity element serving as a donor in the semiconductor layer may be used as the amorphous semiconductor layer 55, so that fluctuation of the threshold voltage can be reduced.

As the substrate 01, an alkali-free glass substrate manufactured by a fusion method or a float method, made of barium borosilicate glass, aluminoborosilicate glass, aluminosilicate glass, or the like; a ceramic substrate; a plastic substrate which has high heat resistance enough to withstand a process temperature of this manufacturing process; or the like can be used. Alternatively, a substrate in which an insulating layer is provided for the surface of a metal substrate made of a stainless alloy or the like may be used. When the substrate 01 is mother glass, the substrate may have any of the following sizes: 1st generation (320 mm×400 mm), 2nd generation (400 mm×500 mm), 3rd generation (550 mm×650 mm), 4th generation (680 mm×880 mm, or 730 mm×920 mm), 5th generation (1000 mm×1200 mm, or 1100 nm×1250 mm), 6th generation (1500 mm×1800 mm), 7th generation (1900 mm×2200 mm), 8th generation (2160 mm×2460 mm), 9th generation (2400 mm×2800 mm, or 2450 mm×3050 mm), 10th generation (2950 mm×3400 mm), and the like.

The gate electrode 05 is formed using a metal material. As the metal material, aluminum, chromium, titanium, tantalum, molybdenum, copper, or the like is used. As a preferable example, the gate electrode 05 is formed using aluminum or has a stack structure of aluminum and a barrier metal. As the barrier metal, a refractory metal such as titanium, molybdenum, or chromium is used. The barrier metal is preferably provided for preventing generation of hillocks and oxidation of aluminum.

The gate electrode 05 is formed with a thickness equal to or greater than 50 nm and equal to or less than 300 nm. With the thickness of the gate electrode 05 being equal to or greater than 50 nm and equal to or less than 100 nm, disconnection at a step of the semiconductor layer or the wiring formed later can be prevented. With the thickness of the gate electrode 05 being equal to or greater than 150 nm and equal to or less than 300 nm, the resistance of the gate electrode 05 can be reduced and the area of the gate electrode 05 can be increased.

It is preferable that the end portion of the gate electrode 05 be processed to be tapered so as to prevent disconnection at a step of the semiconductor layer or wiring formed thereover. Although not shown, in this step, a wiring connected to the gate electrode or a capacitor wiring can also be formed at the same time.

The gate insulating layers 09a and 09b each can be formed using a silicon oxide layer, a silicon nitride layer, a silicon oxynitride layer, or a silicon nitride oxide layer with a thickness of 50 to 150 nm. In this embodiment, a silicon nitride layer or a silicon nitride oxide layer is formed as the gate insulating layer 09a and a silicon oxide layer or a silicon oxynitride layer is formed as the gate insulating layer 09b to form a stack structure. Instead of the two-layer structure, the gate insulating layer may alternatively be formed to have a single-layer structure of a silicon oxide layer, a silicon nitride layer, a silicon oxynitride layer, or a silicon nitride oxide layer.

With the gate insulating layer 09a being formed using a silicon nitride layer or a silicon nitride oxide layer, adhesion between the substrate 01 and the gate insulating layer 09a is increased, which leads to prevention of diffusion of impurities from the substrate 01 into the conductive layers 51a and 51b, the buffer layers 53a and 53b, and the amorphous semiconductor layer 55 when a glass substrate is used as the substrate 01 and to prevention of oxidation of the gate electrode 05. That is, film peeling can be prevented, and electric characteristics of a thin-film transistor completed later can be improved. It is preferable that the thickness of each of the gate insulating layers 09a and 09b be equal to or greater than 50 nm because reduction in coverage caused by surface roughness of the gate electrode 05 can be reduced.

In this specification, the silicon oxynitride layer means a layer having higher composition of oxygen than nitrogen and showing concentration ranges of oxygen, nitrogen, silicon, and hydrogen from 50 to 70 at. %, 0.5 to 15 at. %, 25 to 35 at. %, and 0.1 to 10 at. %, respectively in the measurement using Rutherford backscattering spectrometry (RBS) and hydrogen forward scattering (HFS). Further, the silicon nitride oxide layer means a layer having higher composition of nitrogen than oxygen, and showing the concentration ranges of oxygen, nitrogen, silicon, and hydrogen from 5 to 30 at. %, 20 to 55 at. %, 25 to 35 at. %, and 10 to 30 at. %, respectively in the measurement using RBS and HFS. Note that percentages of nitrogen, oxygen, silicon, and hydrogen fall within the ranges given above, where the total number of oxygen atoms, nitrogen atoms, silicon atoms, and hydrogen atoms contained in the silicon oxynitride film or the silicon nitride oxide film is defined as 100 at. %.

In the case of forming an n-channel thin-film transistor, to form the pair of impurity semiconductor layers 59 and 61 in which the impurity element imparting one conductivity type is added, phosphorus may be added as a typical impurity element; an impurity gas such as $PH_3$ may be added to silicon hydride. On the other hand, in the case of forming a p-channel thin-film transistor, boron may be added as a typical impurity element; an impurity gas such as $B_2H_6$ may be added to silicon hydride. The impurity semiconductor layers 59 and 61 in which the impurity element imparting one conductivity type is added include phosphorus or boron at a concentration of from $1\times10^{19}$ to $1\times10^{21}$ atoms/cm$^3$, thereby having an ohmic contact with the wirings 63 and 65, so that the impurity semiconductor layers 59 and 61 in which the impurity element imparting one conductivity type is added function as the source and drain regions. The pair of impurity semiconductor layers 59 and 61 in which the impurity element imparting one conductivity type is added can be formed using a microcrystalline semiconductor layer or an amorphous semiconductor layer. The pair of impurity semiconductor layers 59 and 61 is each formed with a thickness equal to or greater than 10 nm and equal to or less than 100 nm, preferably equal to or greater than 30 nm and equal to or less than 50 nm. By reducing the thickness of each of the pair of impurity semiconductor layers 59 and 61, the throughput of manufacturing of the pair of impurity semiconductor layers 59 and 61 can be improved.

The pair of impurity semiconductor layers 59 and 61 in which the impurity element imparting one conductivity type is added is overlapped partly with the conductive layers 51a and 51b. With the structure such that a distance denoted by a in FIG. 1A is smaller than each unoverlapped length between the conductive layers 51a and 51b, and the pair of impurity semiconductor layers 59 and 61 (the lengths are denoted by b and c), off-state current of the thin-film transistor is reduced and on-state current thereof is increased, which enables high-speed operation of the thin-film transistor.

It is preferable that the wirings 63 and 65 each be formed using a single layer of aluminum, copper, or an aluminum alloy in which an element for preventing migration, an element for improving heat resistance, or an element for preventing hillocks, such as copper, silicon, titanium, neodymium, scandium, or molybdenum, is added; or a stacked layer thereof. Alternatively, the wirings 63 and 65 each may have a stack structure in which a layer in contact with the impurity semiconductor layer in which the impurity element imparting one conductivity type is added is formed using titanium, tantalum, molybdenum, or tungsten, or nitride of such an element, and aluminum or an aluminum alloy is stacked thereover. Further alternatively, the wirings 63 and 65 each may have a stack structure in which top and bottom surfaces of aluminum or an aluminum alloy each are covered with titanium, tantalum, molybdenum, tungsten, or nitride of such an element. In this embodiment, the wirings 63 and 65 each can have a stack structure of a titanium layer, an aluminum layer, and a titanium layer.

As shown in FIG. 1B, the amorphous semiconductor layer 55 may be formed in contact with the conductive layers 51a and 51b without providing the buffer layers 53a and 53b. The buffer layers 53a and 53b are not formed, whereby throughput of the manufacturing of the buffer layers 53a and 53b can be improved.

The thin-film transistor shown in FIG. 1A has a structure in which the amorphous semiconductor layer 55 is not in contact with the wirings 63 and 65 and the wirings 63 and 65 are formed over the buffer layers 53a and 53b with the pair of impurity semiconductor layers 59 and 61 in which the impurity element imparting one conductivity type is added interposed therebetween. Alternatively, as shown in FIG. 1C, a structure in which a side surface of the amorphous semiconductor layer 55 is in contact with either the wiring 63 or the wiring 65 can be employed.

In the thin-film transistor described in this embodiment, a first thin-film transistor Tr01a second thin-film transistor Tr02, and a third thin-film transistor Tr03 are connected.

The first thin-film transistor Tr01 includes the gate electrode 05, the gate insulating layers 09a and 09b, the conductive layer 51a, the buffer layer 53a, the amorphous semiconductor layer 55, the impurity semiconductor layer 59 in which the impurity element imparting one conductivity type is added, and the wiring 63. The second thin-film transistor Tr02 includes the gate electrode 05, the gate insulating layers 09a and 09b, and the amorphous semiconductor layer 55. The third thin-film transistor Tr03 includes the gate electrode 05, the gate insulating layers 09a and 09b, the conductive layer 51b, the buffer layer 53b, the amorphous semiconductor layer 55, the impurity semiconductor layer 61 in which the impurity element imparting one conductivity type is added, and the wiring 65.

The second thin-film transistor Tr02 is a thin-film transistor in which an amorphous semiconductor layer is used for a channel formation region. On the other hand, the regions where carriers flow in the first thin-film transistor Tr01 and the third thin-film transistor Tr03 are the conductive layer 51a and the conductive layer 51b, respectively; the electrical conductivity of these regions each are 0.9 to 2 S/cm, and the resistivity of which is lower than that of a normal amorphous semiconductor layer or microcrystalline semiconductor layer. Therefore, while a positive voltage which is lower than the threshold voltage of the second thin-film transistor Tr02 is applied to the gate electrode 05, the conductive layers 51a and 51b have a large number of carriers. On applying a positive voltage which is equal to or higher than the threshold voltage of the second thin-film transistor Tr02 to the gate electrode 05, the second thin-film transistor Tr02 is turned on, so that the large number of carriers in the conductive layers 51a and 51b flow into the wiring 63 in the first thin-film transistor Tr01 or the wiring 65 in the third thin-film transistor Tr03.

Channel length L of the thin-film transistor of this embodiment is the sum of the distance a between the conductive layers 51a and 51b, the distance b between the end portion of the impurity semiconductor layer 59 in which the impurity element imparting one conductivity type is added and the end portion of the conductive layer 51a, and the distance c between the end portion of the impurity semiconductor layer 61 in which the impurity element imparting one conductivity type is added and the end portion of the conductive layer 51b. With respect to the channel length L, the distance a between the conductive layers 51a and 51b is made to be small whereas the distance b between the end portion of the impurity semiconductor layer 59 and the end portion of the conductive layer 51a and the distance c between the end portion of the impurity semiconductor layer 61 and the end portion of the conductive layer 51b are each made to be large, so that on-state current is increased and the field-effect mobility is also increased.

In the thin-film transistor described in this embodiment, the conductive layers 51a and 51b are etched using a resist mask formed by photolithography using one photomask. Therefore, alignment of a photomask with submicron accuracy is not needed, leading to reduction of variation of the distance a between the conductive layers 51a and 51b. In addition, the distance a can be reduced to the distance as small as the resolution limit of an exposure apparatus. Further, with the use of a phase-shifting mask, the distance a can be reduced to the distance smaller than the resolution limit of the exposure apparatus. Since the distance a between the conductive layers 51a and 51b is the channel length of the second thin-film transistor which turns on when a positive gate voltage is applied, variation of the channel length can be reduced and the on-state current and filed-effect mobility of the thin-film transistor can be increased by employing the structure of this embodiment.

Since the channel length of the second thin-film transistor Tr02 (i.e., the distance a) can be reduced according to this embodiment, it is preferable that the thickness of the gate insulating film be reduced so as to prevent the short-channel effect in the second thin-film transistor Tr02.

On the other hand, when a negative voltage is applied to the gate electrode 05, even if the conductive layers 51a and 51b have carriers, off-state current of the second thin-film transistor Tr02 is reduced. This is because the off-state current of the second thin-film transistor Tr02, which is formed using an amorphous semiconductor layer, is small.

Accordingly, the thin-film transistor described in this embodiment is a thin-film transistor in which on-state current is large and field-effect mobility is high whereas off-state current is small.

Further, the surface of the amorphous semiconductor layer 55 by which the source region is connected to the drain region, a back-channel, has roughness and is long, so that a leak-path for flowing through the surface of the amorphous semiconductor layer 55 between the source region and the drain region is long. As a result of this, the leakage current flowing through the surface of the amorphous semiconductor layer 55 can be reduced.

Further, since the amorphous semiconductor layer 55 is formed in addition to the gate insulating layers 09a and 09b between the gate electrode 05 and the pair of impurity semiconductor layers 59 and 61 in which the impurity element imparting one conductivity type is added, the distance between the gate electrode 05 and the pair of impurity semiconductor layers 59 and 61 is increased. Hence, parasitic capacitance between the gate electrode 05 and the pair of impurity semiconductor layers 59 and 61 can be decreased. In particular a thin-film transistor in which voltage drop on the drain side is decreased can be formed, therefore, the response speed of pixels in a display device can be increased using this structure. In particular, in the case of a thin-film transistor formed in each pixel of a liquid crystal display device, the response speed of a liquid crystal material can be increased because voltage drop of the drain voltage can be reduced.

Embodiment 2

In this embodiment, other shapes of the conductive layers 51a and 51b and the buffer layers 53a and 53b will be described using FIG. 2.

A thin-film transistor shown as a cross-sectional structure in FIG. 2 is a thin-film transistor in which a buffer layer 53c and a buffer layer 53d are formed inside of a conductive layer 51c and a conductive layer 51d provided with a space therebetween, respectively. That is, in the thin-film transistor, the buffer layers 53c and 53d each with a smaller area than each of the conductive layers 51c and 51d are formed, and the conductive layers 51c and 51d are partly exposed from the respective buffer layers 53c and 53d. With such a structure, when the conductive layers 51c and 51d are microcrystalline semiconductor layers, metal silicide layers, or metal layers, the crystallinity of the amorphous semiconductor layer 55 which is in contact with the conductive layers 51c and 51d can be improved using the microcrystalline semiconductor layers, the metal silicide layers, or the metal layers as crystal growth seeds, leading to high-speed operation of the thin-film transistor and increase of on-state current.

Further, though not shown in the drawing, in any of FIGS. 1A to 1C and FIG. 2, the sidewall of the conductive layer or the buffer layer may be about perpendicular to the bottom surface, or the side surface thereof may be inclined at an angle of 80° to 100°, preferably 85° to 95° to the bottom surface. By making the sidewall of the conductive layer or the buffer layer be about perpendicular to the bottom surface, the area occupied by the thin-film transistor can be reduced. Accordingly, the aperture ratio of a transmissive display device using the thin-film transistor in each pixel can be increased.

This embodiment can be combined with Embodiment 1.

Embodiment 3

In this embodiment, other embodiments of the buffer layers will be described using FIGS. 3A and 3B. In this embodiment, buffer layers 52a and 52b each are formed using an insulating layer.

Figure 3A:
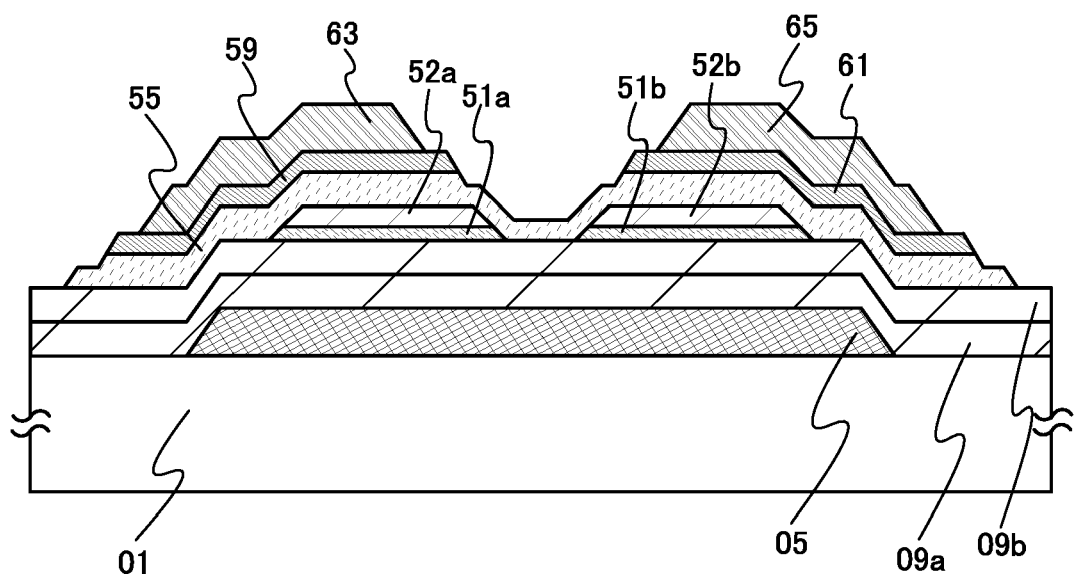
FIGS. 3A and 3B are cross-sectional views each describing a thin-film transistor according to an embodiment of the present invention.

In a thin-film transistor shown in FIG. 3A, a gate electrode 05 is formed over a substrate 01, gate insulating layers 09a and 09b are formed over the gate electrode 05, conductive layers 51a and 51b which are provided with a space therebetween are formed over the gate insulating layer 09b, and the buffer layers 52a and 52b which are provided with a space therebetween are formed over the conductive layers 51a and 51b. The buffer layers 52a and 52b are about overlapped with the conductive layers 51a and 51b. Further, an amorphous semiconductor layer 55 which covers the side surfaces of the conductive layers 51a and 51b and the buffer layers 52a and 52b and the top surfaces of the buffer layers 52a and 52b is formed. A pair of impurity semiconductor layers 59 and 61 in which an impurity element imparting one conductivity type is added is formed over the amorphous semiconductor layer 55, and wirings 63 and 65 are formed over the impurity semiconductor layers 59 and 61.

The buffer layers 52a and 52b each are formed using an insulating layer in this embodiment. Typically, the buffer layers 52a and 52b are formed using an inorganic insulating layer such as a silicon nitride layer, a silicon oxide layer, a silicon nitride oxide layer, or a silicon oxynitride layer. Alternatively, the buffer layers 52a and 52b are formed using an organic insulating layer of polyimide, acrylic resin, epoxy resin, or the like. The buffer layers 52a and 52b each are formed with a thickness of 10 to 150 nm. With the buffer layers 52a and 52b formed using an insulating layer, the leakage current flowing from the pair of impurity semiconductor layers 59 and 61 to the amorphous semiconductor layer 55 can be stemmed, so that leakage current can be reduced. Further, OFF-state current can be reduced.

Figure 3B:
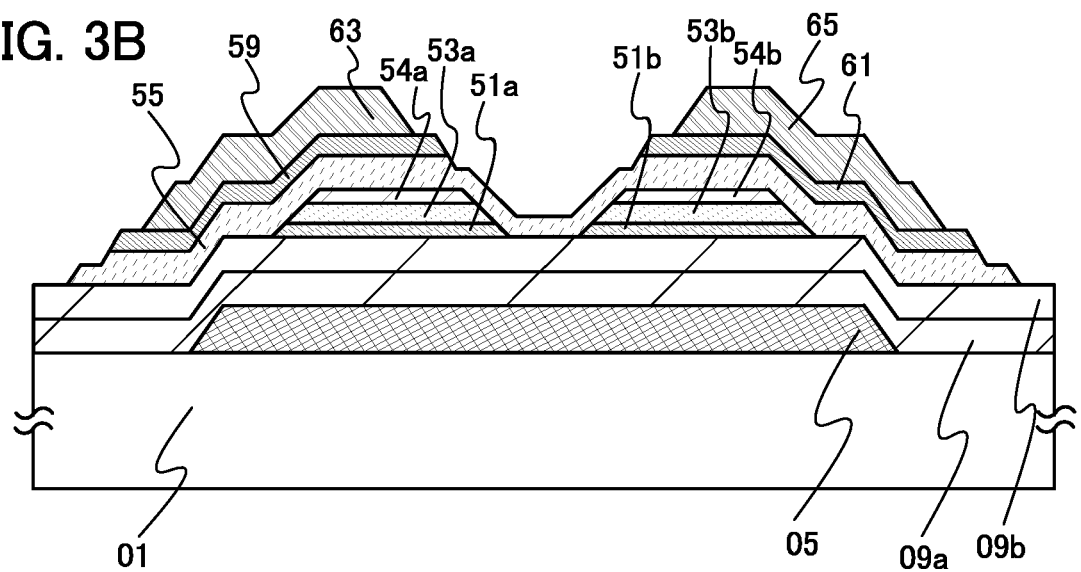

Alternatively, as shown in FIG. 3B, buffer layers 53a and 53b formed using a semiconductor layer may be formed over the conductive layers 51a and 51b, and buffer layers 54a and 54b formed using an insulating layer may be formed over the buffer layers 53a and 53b. The buffer layers 54a and 54b are formed using an inorganic insulating layer such as a silicon nitride layer, a silicon oxide layer, a silicon nitride oxide layer, or a silicon oxynitride layer. Alternatively, the buffer layers 54a and 54b are formed using an organic insulating layer of polyimide, acrylic resin, epoxy resin, or the like.

Although the buffer layers 53a and 53b formed using a semiconductor layer each are thicker than each of the buffer layers 54a and 54b formed using an insulating layer in FIG. 3B, the buffer layers 54a and 54b each may be thicker than each of the buffer layers 53a and 53b. The total thickness of one of the buffer layers 53a and 53b and one of the buffer layers 54a and 54b is 30 to 200 nm, preferably 50 to 150 nm. In the case where the conductive layers 51a and 51b each are a semiconductor layer in which an impurity element serving as an donor is added, with the buffer layers 53a and 53b formed using a semiconductor layer over the semiconductor layers in which the impurity element serving as a donor is added, the oxidation of the semiconductor layers in which the impurity element serving as a donor is added can be reduced and reduction of resistivity of the semiconductor layers in which the impurity element serving as a donor is added can be suppressed. Further, with the buffer layers 54a and 54b formed using an insulating layer over the buffer layers 53a and 53b formed using a semiconductor layer, the leakage current flowing from the pair of impurity semiconductor layers 59 and 61, through the amorphous semiconductor layer 55 can be stemmed, so that leakage current can be reduced. Further, off-state current can be reduced.

This embodiment can be combined with either of Embodiments 1 and 2.

Embodiment 4

In this embodiment, other embodiments of the conductive layers 51a and 51b will be described.

Figure 4:
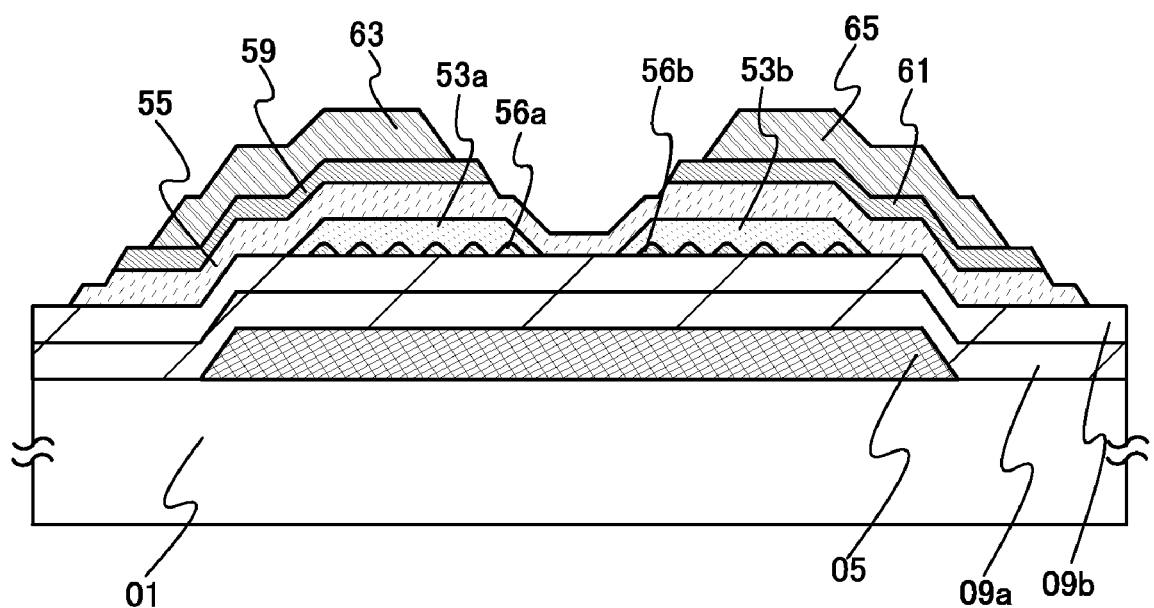
FIG. 4 is a cross-sectional view describing a thin-film transistor according to an embodiment of the present invention.

In a thin-film transistor shown in FIG. 4, a gate electrode 05 is formed over a substrate 01, gate insulating layers 09a and 09b are formed over the gate electrode 05, conductive particles 56a and 56b which are provided with a space therebetween are formed over the gate insulating layer 09b, and buffer layers 53a and 53b which are provided with a space therebetween are formed over the conductive particles 56a and 56b and the gate insulating layer 09b. The buffer layers 53a and 53b are about overlapped with the conductive particles 56a and 56b. Further, an amorphous semiconductor layer 55 which covers the side and top surfaces of the buffer layers 53a and 53b is formed. A pair of impurity semiconductor layers 59 and 61 in which an impurity element imparting one conductivity type is added is formed over the amorphous semiconductor layer 55, and wirings 63 and 65 are formed over the impurity semiconductor layers 59 and 61.

The conductive particles 56a and 56b can be formed using conductive particles formed using an appropriate conductive material of the conductive layer described in the above-described embodiment. In the case where the conductive particles 56a and 56b each are a semiconductor crystal grain in which an impurity element serving as a donor is added, the semiconductor crystal grain can be formed using silicon, silicon germanium ($Si_xGe_{1-x}$, $0.5<X<1$) having higher composition of silicon than germanium, or the like. By forming the conductive particles 56a and 56b such that the size is 1 to 30 nm and the density is less than $1\times10^{13}/cm^2$, preferably less than $1\times10^{10}/cm^2$, crystal grains can be formed separately, so that the adhesion between the buffer layers 53a and 53b formed later and the gate insulating layer 09b can be increased. As a result, the yield of thin-film transistors can be improved.

In the case where the conductive particles 56a and 56b each are a metal particle, a metal nitride particle, a metal carbide particle, a metal boride particle, or a metal silicide particle, the conductive particles 56a and 56b can be formed by a sputtering method, an evaporation method, a droplet discharge method, or a CVD method.

In the case where the conductive particles 56a and 56b are semiconductor crystal grains in which an impurity element serving as a donor is added, the semiconductor crystal grains can be formed as follows: a microcrystalline semiconductor layer in which an impurity element serving as a donor is added is formed by a sputtering method or a plasma CVD method, and is exposed to hydrogen plasma, so that an amorphous semiconductor in the microcrystalline semiconductor layer in which the impurity element serving as a donor is added is etched. Alternatively, the semiconductor crystal grains can be formed by forming a microcrystalline semiconductor layer or a crystalline semiconductor layer in which an impurity element serving as a donor is added by a sputtering method or a plasma CVD method with a thickness where crystal grains are not consecutive but are dispersed.

Instead of the conductive particles 56a and 56b, separated conductive layers may be formed by forming a conductive layer over the gate insulating layer 09b and etching using a resist mask formed by photolithography.

Since the conductive particles 56a and 56b are not consecutive and the amorphous semiconductor layer 55 is formed therebetween, increase in off-state current can be reduced even when the conductive particles 56a and 56b are formed so as to be overlapped with the pair of impurity semiconductor layers 59 and 61. Since a buffer layer is not formed, the number of photomasks can be reduced by one, which improves the throughput and reduces the cost.

This embodiment can be combined with any one of Embodiments 1 to 3.

Embodiment 5

In this embodiment, other embodiments of the amorphous semiconductor layer will be described.

Figure 5:
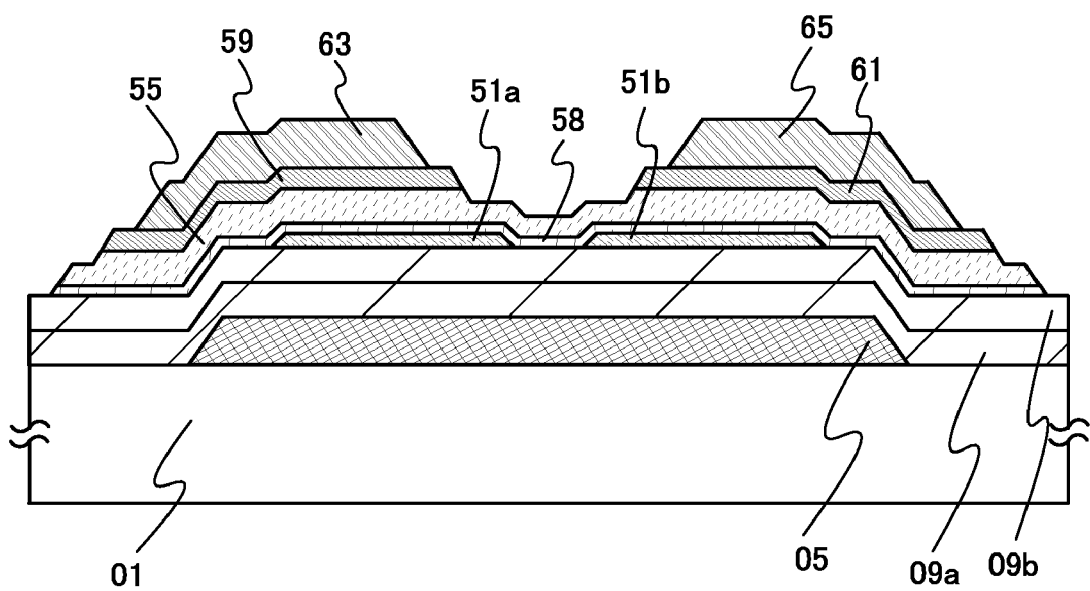
FIG. 5 is a cross-sectional view describing a manufacturing process of a thin-film transistor according to an embodiment of the present invention.

In a thin-film transistor shown in FIG. 5, a gate electrode 05 is formed over a substrate 01, gate insulating layers 09a and 09b are formed over the gate electrode 05, and conductive layers 51a and 51b which are provided with a space therebetween are formed over the gate insulating layer 09b. Further, a microcrystalline semiconductor layer 58 which covers the side and top surfaces of the conductive layers 51a and 51b is formed, and an amorphous semiconductor layer 55 is formed over the microcrystalline semiconductor layer 58. The shapes of the microcrystalline semiconductor layer 58 and the amorphous semiconductor layer 55 are about the same. A pair of impurity semiconductor layers 59 and 61 in which an impurity element imparting one conductivity type is added is formed over the amorphous semiconductor layer 55, and wirings 63 and 65 are formed over the impurity semiconductor layers 59 and 61.

The microcrystalline semiconductor layer 58 can be formed using a microcrystalline silicon layer, a microcrystalline silicon germanium layer, or a microcrystalline germanium layer. An impurity element serving as a donor may be added into the microcrystalline semiconductor layer 58 at a lower concentration than the concentration of an impurity element serving as a donor included in a semiconductor layer which can be used for the conductive layers 51a and 51b. With the impurity element serving as a donor added at a lower concentration, the threshold voltage of the thin-film transistor can be controlled.

The buffer layer shown in any of FIGS. 1A and 1C, FIG. 2, and FIGS. 3A and 3B may be provided between the microcrystalline semiconductor layer 58 and each of the conductive layers 51a and 51b.

By reducing the thickness of the microcrystalline semiconductor layer 58 from 5 to 30 nm, preferably from 10 nm to 20 nm, off-state current of the thin-film transistor can be low. Further, in the thin-film transistor in which the amorphous semiconductor layer 55 is formed between the microcrystalline semiconductor layer 58 and the pair of impurity semiconductor layers 59 and 61, off-state current can be reduced as compared to a thin-film transistor formed using a microcrystalline semiconductor layer. Further, with the microcrystalline semiconductor layer 58 the resistivity of which is lower than that of an amorphous semiconductor layer, provided between the amorphous semiconductor layer 55 and the gate insulating layer 09b, flowing of carriers is facilitated and high-speed operation of the thin-film transistor can be performed.

Further, by forming a silicon oxide layer or a silicon oxynitride layer as the gate insulating layer 09b and a microcrystalline silicon layer as the microcrystalline semiconductor layer 58, fluctuation of the threshold voltage can be reduced as compared to the case in which the gate insulating layer 09b is formed using a silicon nitride layer and an amorphous semiconductor layer is formed without forming a microcrystalline semiconductor layer.

This embodiment can be combined with any one of Embodiments 1 to 4.

Embodiment 6

In this embodiment, another embodiment of the structure of the thin-film transistor will be described.

Figure 6A:
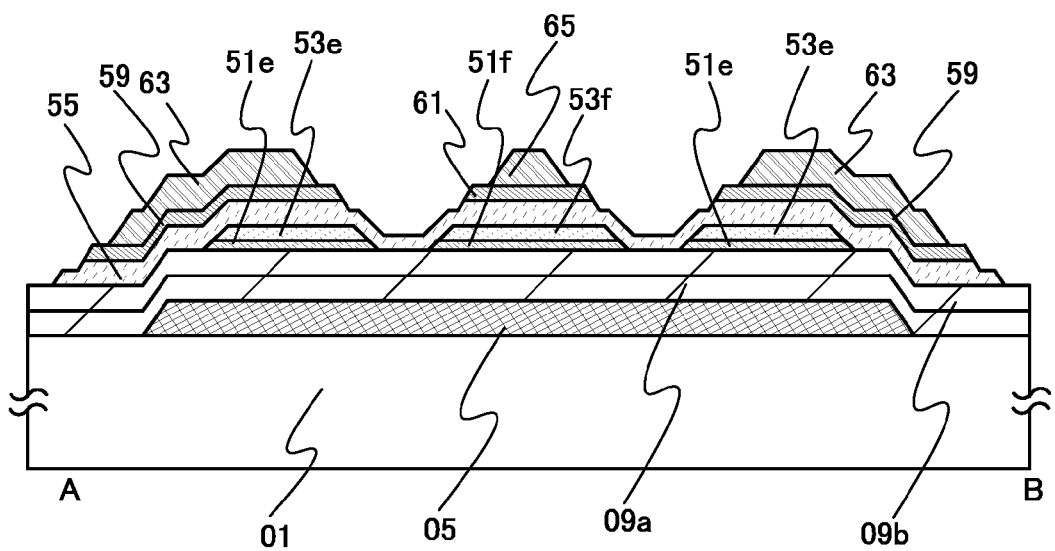
FIGS. 6A and 6B are a cross-sectional view and a top view describing a thin-film transistor according to an embodiment of the present invention.
Figure 6B:
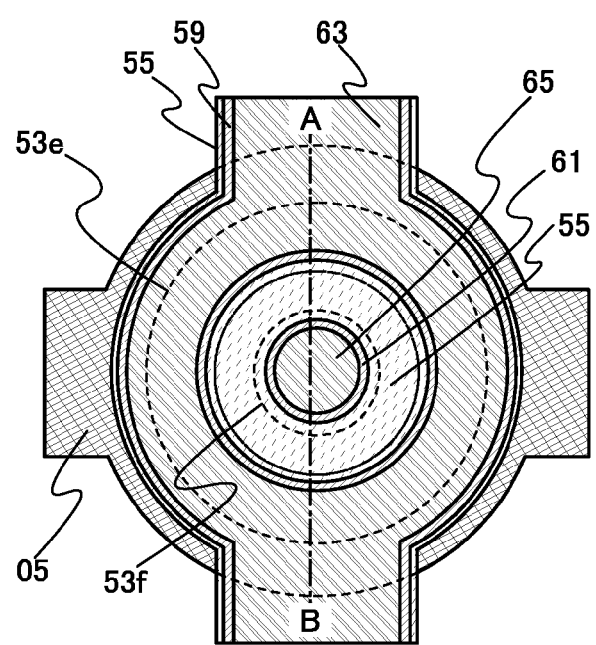

In a thin-film transistor shown in FIGS. 6A and 6B, a gate electrode 05 is formed over a substrate 01, gate insulating layers 09a and 09b are formed over the gate electrode 05, a ring conductive layer 51e and a circular conductive layer 51f are formed over the gate insulating layer 09b, and a ring buffer layer 53e and a circular buffer layer 53f are formed over the ring conductive layer 51e and the circular conductive layer 51f respectively. The buffer layers 53e and 53f are about overlapped with the conductive layers 51e and 51f. Further, an amorphous semiconductor layer 55 which covers the side surfaces of the conductive layers 51e and 51f and the buffer layers 53e and 53f and the top surfaces of the buffer layers 53e and 53f is formed. A pair of impurity semiconductor layers 59 and 61 in which an impurity element imparting one conductivity type is added is formed over the amorphous semiconductor layer 55, and wirings 63 and 65 are formed over the pair of impurity semiconductor layers 59 and 61.

In the thin-film transistor shown in FIGS. 6A and 6B, the channel formation region is provided in the form of a ring, where the source region and the drain region face each other. Specifically, the impurity semiconductor layer 59 which is one of the pair of impurity semiconductor layers 59 and 61 is in a ring; and the impurity semiconductor layer 61 which is the other of the pair of impurity semiconductor layers 59 and 61 is in a circle. That is, one of the source region or the drain region surrounds the other of the source region or the drain region with a certain space interposed therebetween. Therefore, when the wiring 63 is a source wiring and the wiring 65 is a drain wiring, the curved channel formation region enables the fluctuation of the threshold voltage to be reduced, so that reliability of characteristics of the thin-film transistor can be increased. Further, an area in which the curved source region and the curved drain region of the thin-thin film transistor face each other is larger than an area in which a linear source wiring and a linear drain wiring of a typical thin-film transistor face each other, so that the area of the thin-film transistor can be smaller than that of the typical thin-film transistor when the same channel width is employed to the above two types of transistors in the design.

This embodiment can be combined with any one of Embodiments 1 to 5.

Embodiment 7

Described in this embodiment will be a manufacturing process of the thin-film transistor as shown in FIG. 1A, in which high-speed operation can be performed and on-state current is large and off-state current is small.

An n-channel thin-film transistor having an amorphous semiconductor layer or a microcrystalline semiconductor layer is more suitable for use in a driver circuit than a p-channel one because an n-channel transistor has a higher field-effect mobility than a p-channel transistor. It is preferable that all thin-film transistors formed over the same substrate have the same conductivity type, in order to reduce the number of steps. In this embodiment description is made using an n-channel thin-film transistor.

The manufacturing process of the thin-film transistor shown in FIG. 1A is described using FIGS. 7A to 7E, FIGS. 8A to 8C, FIGS. 9A to 9D, and FIG. 10. Note that the left sides of FIGS. 7A to 7E and FIGS. 8A to 8C are each a cross-sectional view taken along line A-B of FIG. 10, which illustrates a cross section of a region where the thin-film transistor is formed; and the right sides thereof are each a cross-sectional view taken along line C-D of FIG. 10, which illustrates a cross section of a region where the gate wiring and the source wiring intersect each other in each pixel.

Figure 7A:
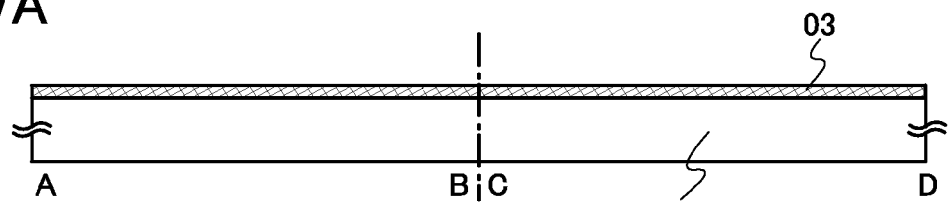
FIGS. 7A to 7E are cross-sectional views describing a manufacturing process of the thin-film transistor according to an embodiment of the present invention.

As shown in FIG. 7A, a conductive layer 03 is formed over a substrate 01. The conductive layer 03 can be formed using the material used for the gate electrode 05 described in Embodiment 1. The conductive layer 03 is formed by a sputtering method, a CVD method, a plating method, a printing method, a droplet discharge method, or the like.

Figure 7B:
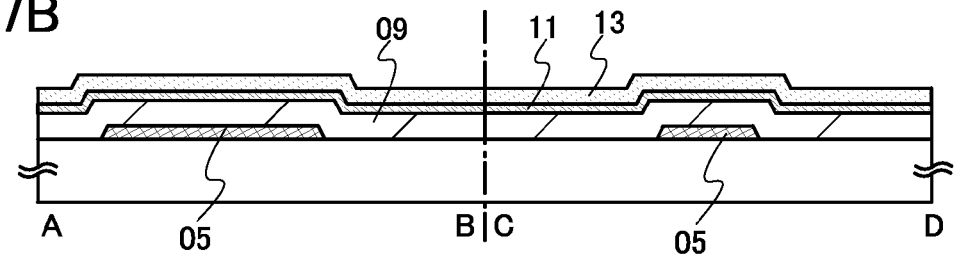

Next, with a resist mask which is formed by photolithography using a first photomask, the conductive layer 03 is etched into a desired shape to form a gate wiring 05, as shown in FIG. 7B. After that, the resist mask is removed.

Then, a gate insulating layer 09 is formed over the gate wiring 05 and the substrate 01. The gate insulating layer 09 can be formed using the material used for the gate insulating layers 09a and 09b described in Embodiment 1. The gate insulating layer 09 is formed by a CVD method, a sputtering method, or the like.

Next, a conductive layer 11 and a buffer layer 13 are stacked over the gate insulating layer 09. The film formation method in the case where the conductive layer 11 is a semiconductor layer in which an impurity element serving as a donor is added will be described below.

In a reaction chamber of a plasma CVD apparatus, hydrogen and a deposition gas including silicon or germanium are mixed, and a microcrystalline semiconductor layer or an amorphous semiconductor layer is formed by glow discharge plasma. The microcrystalline semiconductor layer is formed on the condition that the flow rate of the deposition gas including silicon or germanium is reduced by addition of hydrogen whose flow rate is 10 to 2000 times, preferably 50 to 200 times higher than that of the deposition gas. The amorphous semiconductor layer is formed on the condition that the flow rate of the deposition gas including silicon or germanium is reduced by addition of hydrogen whose flow rate is 0 to 10 times, preferably 1 to 5 times higher than that of the deposition gas. The temperature for heating the substrate is set at 100° C. to 300° C., preferably 120° C. to 220° C. Then, a gas including phosphorus, arsenic, antimony, or the like is mixed in addition to the above-described source gas, so that the semiconductor layer in which the impurity element serving as a donor is added can be formed. In this embodiment, as the semiconductor layer in which the impurity element serving as a donor is added, a microcrystalline silicon layer including phosphorus can be formed by glow discharge plasma, with phosphine mixed in addition to silane and hydrogen and/or a rare gas.

In the step of forming the semiconductor layer in which the impurity element serving as a donor is added, glow discharge plasma is generated by applying high-frequency powers of about 3 to 30 MHz, typically 13.56 or 27.12 MHz; or very high-frequency powers of about greater than 30 MHz and less than or equal to 300 MHz, typically 60 MHz.

As typical examples of the deposition gas including silicon or germanium, $SiH_4$, $Si_2H_6$, $GeH_4$, $Ge_2H_6$, and the like can be given.

Note that instead of forming the semiconductor layer in which the impurity element serving as a donor is added, an insulating layer in which an impurity element serving as a donor is added may be formed as the gate insulating layer 09, and a semiconductor layer which does not include an impurity element serving as a donor may be formed thereover. For example, a silicon oxide layer, a silicon nitride layer, a silicon oxynitride layer, a silicon nitride oxide layer, or the like including an impurity element serving as a donor (phosphorus, arsenic, or antimony) can be formed as the gate insulating layer. Alternatively, when the gate insulating layer 09 has a stack structure, the impurity element serving as a donor may be added to a layer in contact with the microcrystalline semiconductor layer or a layer in contact with the substrate 01.

As the method for forming the insulating layer in which the impurity element serving as a donor is added as the gate insulating layer 09, the insulating layer may be formed using a gas including the impurity element serving as a donor in addition to the source gas of the insulating layer. For example, a silicon nitride layer including phosphorus can be formed by a plasma CVD method using silane, ammonia, and phosphine. On the other hand, by a plasma CVD method using silane, dinitrogen monoxide, ammonia, and phosphine, a silicon oxynitride layer including phosphorus can be formed.

Alternatively, before the gate insulating layer 09 is formed, a gas including an impurity element serving as a donor may be introduced into the reaction chamber of the film formation apparatus such that the impurity element serving as a donor is adsorbed on the surface of the substrate 01 and the inner wall of the reaction chamber. After that, an insulating layer is deposited while the impurity element serving as a donor is being taken in to form the gate insulating layer 09, so that the gate insulating layer 09 in which the impurity element serving as a donor is added can be formed.

Further alternatively, before the semiconductor layer in which the impurity element serving as a donor is added is formed, a gas including an impurity element serving as a donor may be introduced into the reaction chamber of the film formation apparatus such that the impurity element serving as a donor is adsorbed on the gate insulating layer 09 and the inner wall of the reaction chamber. After that a semiconductor layer is deposited while the impurity element serving as a donor is being taken in to form the semiconductor layer, so that the semiconductor layer in which the impurity element serving as a donor is added can be formed.

In the case where the conductive layer 11 is a metal layer, a metal nitride layer, a metal carbide layer, a metal boride layer, or a metal silicide layer, the conductive layer is formed by a sputtering method, an evaporation method, a CVD method, a droplet discharge method, a printing method, or the like.

Note that when the gate insulating layer 09 is a silicon oxide layer or a silicon oxynitride layer, the surface of the gate insulating layer 09 may be subjected to a plasma treatment before the conductive layer 11 is formed. Typically, plasma such as hydrogen plasma, ammonia plasma, $H_2O$ plasma, helium plasma, argon plasma, or neon plasma is exposed to the surface of the gate insulating layer 09. Consequently, a defect at a surface of the gate insulating layer can be reduced. Typically, dangling bonds of the surface of the gate insulating layer 09 can be terminated. After that, a conductive layer or an amorphous semiconductor layer is formed, so that a defect at the interface with the conductive layer or the amorphous semiconductor can be reduced. Consequently, the number of carriers captured due to the defect can be reduced, which leads to increase in on-state current.

Next the buffer layer 13 is formed. In the case where a semiconductor layer is formed as the buffer layer 13, an amorphous semiconductor layer can be formed by a plasma CVD method using a deposition gas including silicon or germanium. Alternatively, by dilution of a deposition gas including silicon or germanium with one or plural kinds of rare gases selected from helium, argon, krypton, or neon, an amorphous semiconductor layer can be formed. Further alternatively, with the use of hydrogen at a flow rate which is greater than or equal to 0 time and less than or equal to 10 times, more preferably greater than or equal to 1 time and less than or equal to 5 times higher than that of a silane gas, an amorphous semiconductor layer including hydrogen can be formed In addition, a halogen such as fluorine or chlorine may be added to the above hydrogenated semiconductor layer.

Alternatively, as the amorphous semiconductor layer, an amorphous semiconductor layer can be formed by sputtering with hydrogen or a rare gas using a semiconductor such as silicon or germanium as a target.

In the case where an insulating layer is formed as the buffer layer 13, it can be formed in a manner similar to that of the gate insulating layer 09. Alternatively, polyimide, an acrylic resin, an epoxy resin, or another material for an organic insulating layer is applied and baked to form the insulating layer.

In addition, in the case where the conductive layer 11 is the semiconductor layer in which the impurity element serving as a donor is added, it is preferable that the buffer layer 13 is formed at a temperature of 300° C. to 400° C. by a plasma CVD method. By this film formation treatment, hydrogen is supplied to the semiconductor layer in which the impurity element serving as a donor is added, which brings the same effect as the hydrogenation of the semiconductor layer in which the impurity element serving as a donor is added. In other words, hydrogen is diffused in the semiconductor layer in which the impurity element serving as a donor is added by depositing the buffer layer 13 over the semiconductor layer in which the impurity element serving as a donor is added so that the dangling bonds can be terminated.

When the semiconductor layer in which the impurity element serving as a donor is added is formed of a microcrystalline semiconductor layer, surfaces of crystal grains contained in the semiconductor layer in which the impurity element serving as a donor is added can be prevented from native oxidation, by forming an amorphous semiconductor layer, particularly, an amorphous semiconductor layer including hydrogen, nitrogen, or a halogen as the buffer layer 13. In particular, in a region where an amorphous semiconductor is in contact with microcrystal grains, a crack is likely to be caused due to local stress. When the crack is exposed to oxygen, the crystal grain is oxidized, so that silicon oxide is formed on the crystal grain. However, the oxidization of microcrystal grains can be prevented by forming an amorphous semiconductor layer on the surface of the semiconductor layer in which the impurity clement serving as a donor is added. In a display device, typically in a liquid crystal display device, including a thin-film transistor in which high voltage (e.g., about 15 V) is applied, when the buffer layer is formed with a large thickness, drain withstand voltage becomes high. Thus, deterioration of the thin-film transistor can be reduced even when high voltage is applied to the thin-film transistor.

Figure 7C:
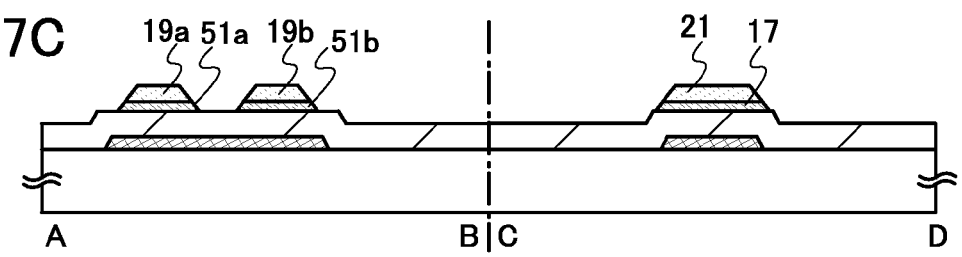

Next, a resist mask is formed by photolithography using a resist which is applied over the buffer layer 13 and a second photomask. The buffer layer 13 and the conductive layer 11 are etched into desired shapes to form conductive layers 51*a* and 51*b* which are provided with a space therebetween and buffer layers 19*a* and 19*b* which are provided with a space therebetween in a region for forming a thin-film transistor, as shown in FIG. 7C. In addition, in the region where the gate wiring and the source wiring are intersected to each other, a conductive layer 17 and a buffer layer 21 are formed. After that, the resist mask is removed.

Figure 7D:
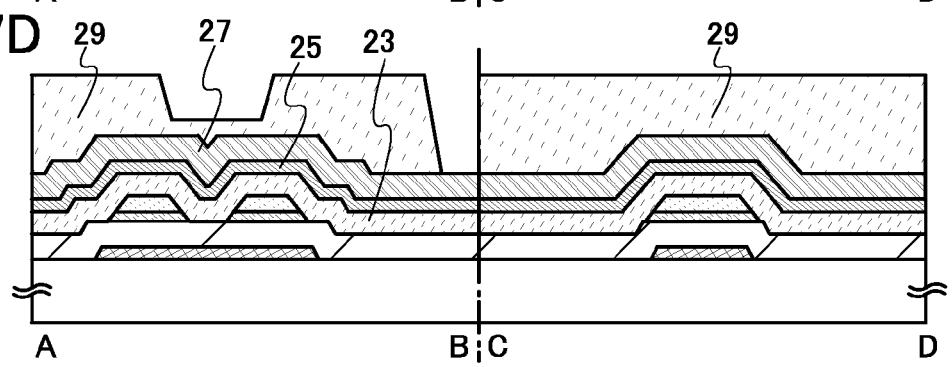

Next, as shown in FIG. 7D, an amorphous semiconductor layer 23 and an impurity semiconductor layer 25 in which an impurity element imparting one conductivity type is added are formed.

The amorphous semiconductor layer 23 can be formed in a manner similar to that in the case of forming the buffer layer 13 using a semiconductor layer.

When the amorphous semiconductor layer 23 is formed, a dense amorphous semiconductor layer can be formed without crystallization by the following manner: the inner wall of the film formation chamber of the plasma CVD apparatus is precoated with a silicon nitride oxide layer, a silicon nitride layer, a silicon oxide layer, or a silicon oxynitride layer, and the flow rate of the deposition gas is reduced to form a semiconductor layer by addition of hydrogen whose flow rate is 10 to 2000 times, preferably 50 to 200 times higher than that of the deposition gas, so that the film is deposited while oxygen, nitrogen, or the like of the inner wall of the film formation chamber is being taken in the film. Note that the semiconductor layer contains a microcrystal in some cases. In addition, when the gate insulating layer 09 is a silicon nitride layer, the amorphous semiconductor layer formed by this film formation method can be prevented from film peeling and can increase the yield.

In this embodiment, an n-channel thin-film transistor is formed, and thus, the impurity semiconductor layer 25 in which the impurity element imparting one conductivity type is added is formed by a plasma CVD method using phosphine and a deposition gas including silicon or germanium. In the case of forming a p-channel thin-film transistor, it is formed by a plasma CVD method using diborane and a deposition gas including silicon or germanium.

In the steps of forming the conductive layer 11, the buffer layer 13, the amorphous semiconductor layer 23, and the impurity semiconductor layer 25 in which the impurity element imparting one conductivity type is added, glow discharge plasma is generated by applying high-frequency powers of about 3 to 30 MHz, typically 13.56 MHz or 27.12 MHz; or very high-frequency powers of about greater than 30 MHz and less than or equal to 300 MHz, typically 60 MHz.

A conductive layer 27 can be formed using the material used for the wirings 63 and 65 described in Embodiment 1. The conductive layer 27 is formed by a CVD method, a sputtering method, a printing method, a droplet discharge method, or the like.

Next, a resist is applied over the conductive layer 27. As the resist, a positive type resist or a negative type resist can be used. In this embodiment, a positive type resist is used.

Then, the resist is irradiated with light, using a multi-tone mask as a third photomask, and then developed to form a resist mask 29.

Now, light exposure using the multi-tone mask is described using FIGS. 9A to 9D.

A multi-tone mask is a mask providing three levels of light exposure as an exposed portion, a half-exposed portion, and an unexposed portion, and can form a resist mask having regions with plural thicknesses (typically, two kinds of thicknesses) by one exposure and development step. Thus, the number of photomasks can be reduced by using a multi-tone mask.

Figure 9A:
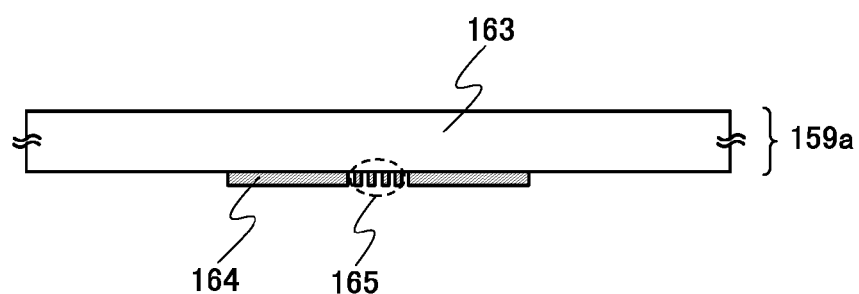
FIGS. 9A to 9D are diagrams describing multi-tone masks applicable to the embodiment of the present invention.
Figure 9B:
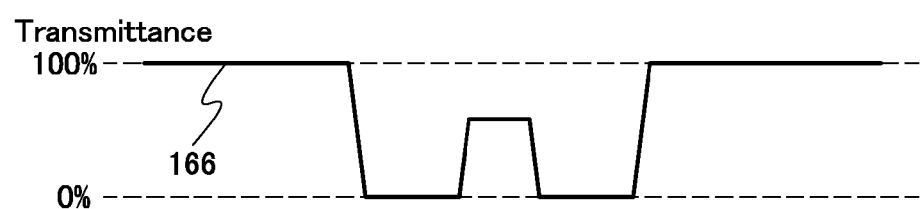
Figure 9C:
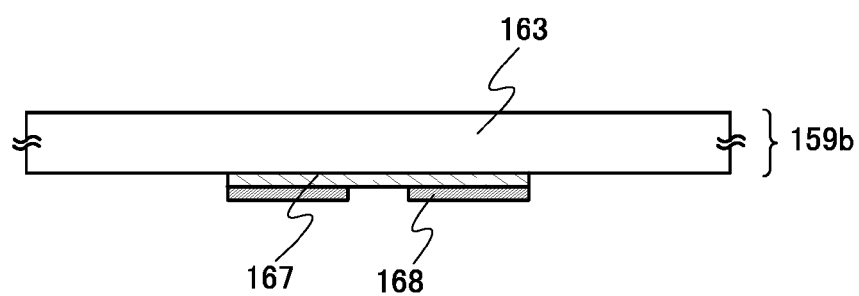
Figure 10:
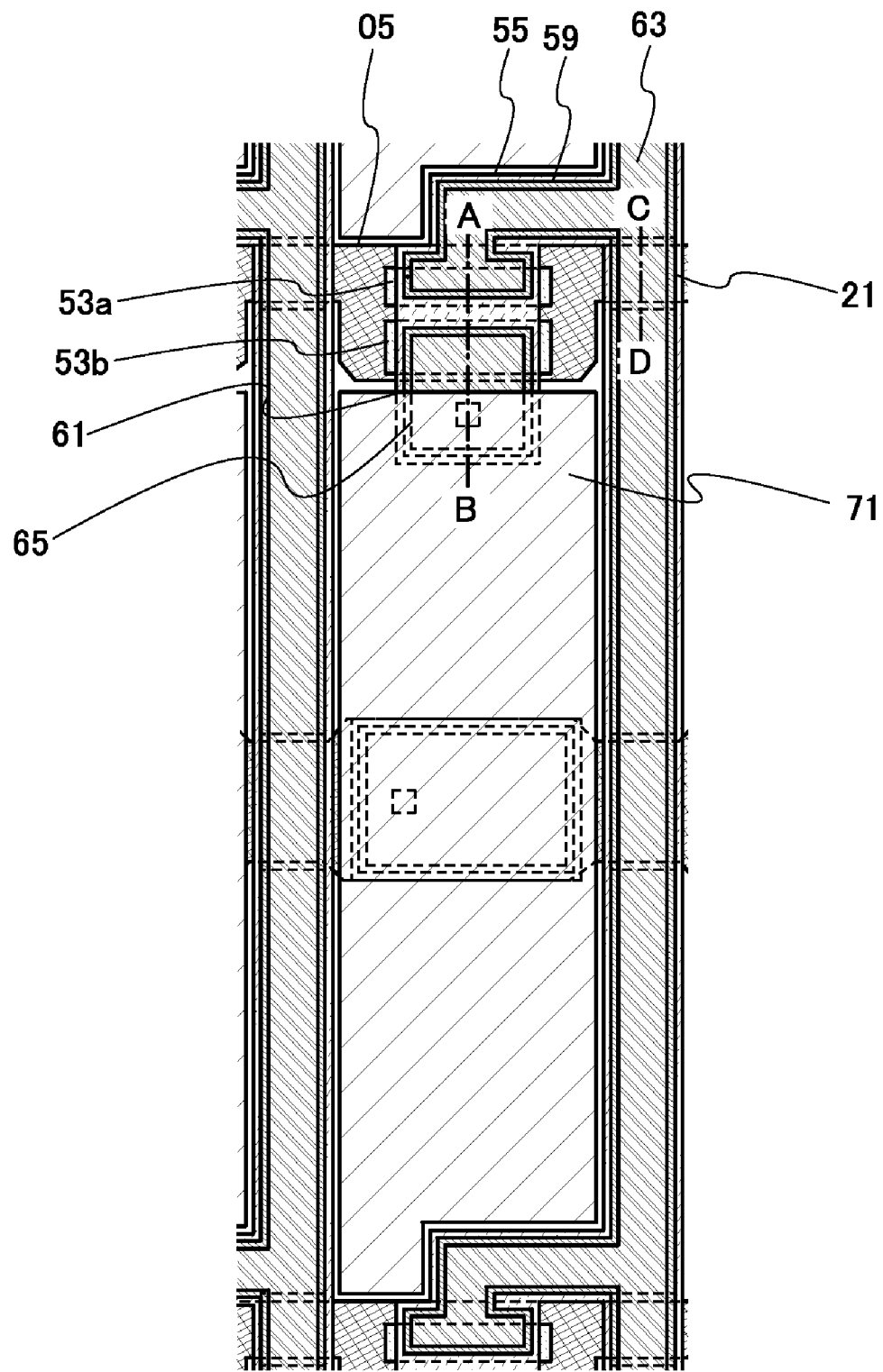
FIG. 10 is a top view describing the manufacturing process of the thin-film transistor according to the embodiment of the present invention.

Typical examples of a multi-tone mask include a gray-tone mask 159a as shown in FIG. 9A and a half-tone mask 159b as shown in FIG. 9C.

As shown in FIG. 9A, the gray-tone mask 159a includes a light-transmitting substrate 163, and a light-blocking portion 164 and a diffraction grating 165 formed thereover. The light transmittance of the light-blocking portion 164 is 0%. On the other hand, the diffraction grating 165 has a light-transmitting portion in a slit form, a dot form, a mesh form, or the like with intervals, which are less than or equal to the resolution limit for light used for the exposure; thus, the light transmittance can be controlled. The diffraction grating 165 can be in a slit, dot form, or mesh form with either regular or irregular intervals.

For the light-transmitting substrate 163, a light-transmitting substrate such as a quartz substrate can be used. The light blocking portion 164 and the diffraction grating 165 can be formed using a light blocking material such as chromium or chromium oxide, which absorbs light.

When the gray-tone mask 159a is irradiated with light for exposure, light transmittance 166 of the light blocking portion 164 is 0% and that of a region where neither the light blocking portion 164 nor the diffraction grating 165 is provided is 100%, as shown in FIG. 9B. The light transmittance of the diffraction grating 165 can be controlled in a range of 10 to 70%. The light transmittance of the diffraction grating 165 can be controlled with an interval or a pitch of slits, dots, or meshes of the diffraction grating 165.

As shown in FIG. 9C, the half-tone mask 159b includes a light-transmitting substrate 163, and a semi-transmissive portion 167 and a light blocking portion 168 formed thereover. The semi-transmissive portion 167 can be formed using MoSiN, MoSi, MoSiO, MoSiON, CrSi, or the like. The light blocking portion 168 can be formed using a light blocking material such as chromium or chromium oxide, which absorbs light.

Figure 9D:
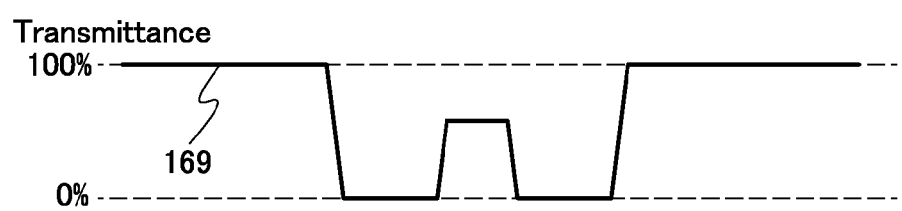

When the half-tone mask 159b is irradiated with light for exposure, light transmittance 169 of the light blocking portion 168 is 0% and that of a region where neither the light blocking portion 168 nor the semi-transmissive portion 167 is provided is 100%, as shown in FIG. 9D. Further, the light transmission in the semi-transmissive portion 167 can be controlled within the range of 10 to 70%. The light transmittance of the semi-transmissive portion 167 can be controlled with a material of the semi-transmissive portion 167.

After the light exposure using the multi-tone mask, development is performed, whereby the resist mask 29 with regions having different thicknesses can be formed, as shown in FIG. 7D.

Figure 7E:
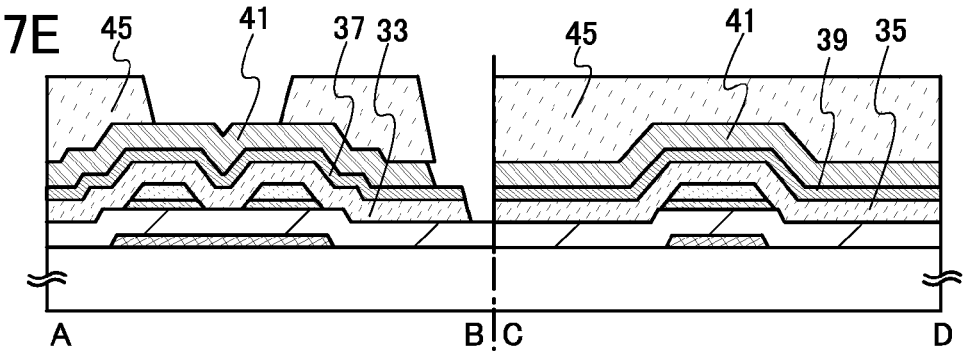

Next, by the resist mask 29, the amorphous semiconductor layer 23, the impurity semiconductor layer 25 in which the impurity element imparting one conductivity type is added, and the conductive layer 27 are etched to be separated. Consequently, amorphous semiconductor layers 33 and 35, semiconductor layers 37 and 39 in which the impurity element imparting one conductivity type is added, and a conductive layer 41 as shown in FIG. 7E can be formed.

Next, ashing is performed on the resist mask 29. Consequently, the area and the thickness of the resist are reduced. At this time, the resist in a region with a small thickness (a region overlapping with part of the gate wiring 05) is removed to form a separated resist mask 45 as shown in FIG. 7E.

Figure 8A:
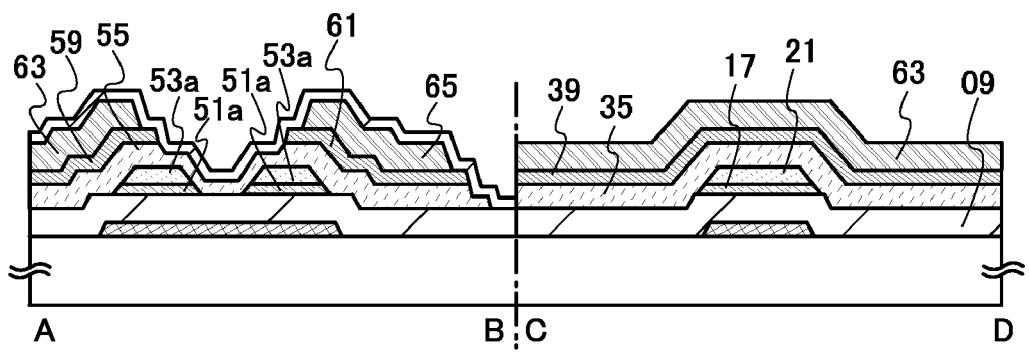
FIGS. 8A to 8C are cross-sectional views describing the manufacturing process of the thin-film transistor according to the embodiment of the present invention.

Next, the conductive layer 41 is etched to be separated using the resist mask 45. Consequently, a source wiring 63 and a drain electrode 65 as shown in FIG. 8A can be formed. When wet etching is performed on the conductive layer 41 with the resist mask 45, the conductive layer 41 is etched isotropically. Consequently, the source wiring 63 and the drain electrode 65 which are smaller than the resist mask 45 in area can be formed.

In a portion where the gate wiring 05 and the impurity semiconductor layer 39 in which the impurity element imparting one conductivity type is added are intersected to each other, the conductive layer 17, the buffer layer 21, and the amorphous semiconductor layer 35 are formed in addition to the gate insulating layer 09; and the distance between the gate wiring 05 and the impurity semiconductor layer 39 is increased. Therefore, the parasitic capacitance in the region where the gate wiring 05 and the impurity semiconductor layer 39 are intersected to each other can be reduced.

Next, with the use of the resist mask 45, the semiconductor layer 37 in which the impurity element imparting one conductivity type is added is etched to form a pair of impurity semiconductor layers 59 and 61 in which the impurity element imparting one conductivity type is added. Note that in the etching step, part of the amorphous semiconductor layer 33 is also etched to be an amorphous semiconductor layer 55.

In this embodiment, end portions of the source wiring 63 and the drain electrode 65 are misaligned with end portions of the pair of impurity semiconductor layers 59 and 61. The end portions of the pair of impurity semiconductor layers 59 and 61 lies outside the end portions of the source wiring 63 and the drain electrode 65, respectively After that, the resist mask 45 is removed.

Next, the exposed amorphous semiconductor layer 55 may be irradiated with $H_2O$ plasma. Typically, exposed portions of the amorphous semiconductor layer 55, the pair of impurity semiconductor layers 59 and 61, the source wiring 63, and the drain electrode 65 are irradiated with radicals which are generated by plasma discharging of water that is vaporized, so that operation at high speed of the thin-film transistor can be performed and the on-state current can be further increased. In addition, the off-state current can be reduced.

Through the above-described process, a thin-film transistor can be formed.

Figure 8B:
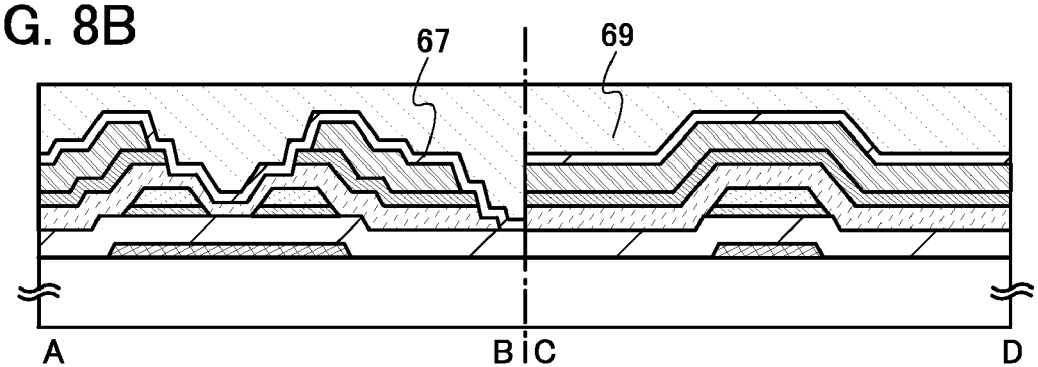

Next, as shown in FIG. 8B, a protective insulating layer 67 is formed over the source wiring 63, the drain electrode 65, and the gate insulating layer 09. The protective insulating layer 67 can be formed using a silicon nitride layer, a silicon nitride oxide layer, a silicon oxide layer, or a silicon oxynitride layer. The protective insulating layer 67 prevents intrusion of a contaminating impurity such as an organic matter, a metal, or water vapor included in the air; thus, a dense film is preferably used for the protective insulating layer 67.

Figure 8C:
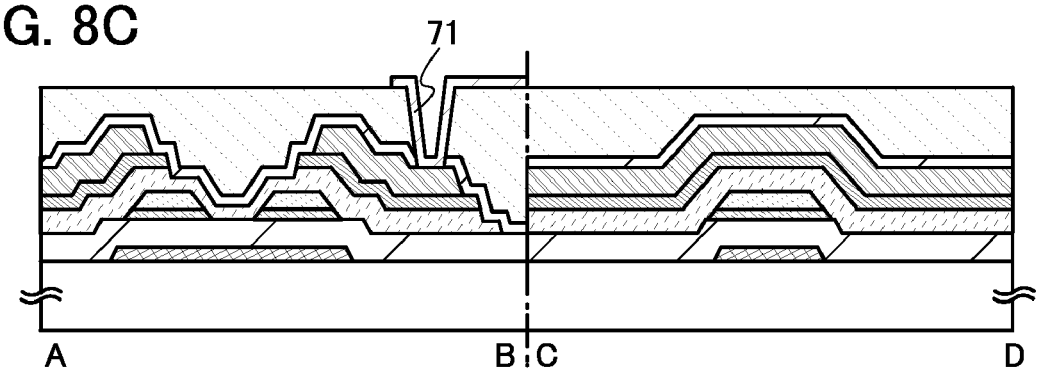

Next, a planarizing layer 69 may be formed over the protective insulating layer 67. The planarizing layer 69 can be formed using an organic insulating layer of an acrylic resin, polyimide, an epoxy resin, a siloxane polymer, or the like. In this embodiment, the planarizing layer 69 is formed using a photosensitive organic resin. Then, the planarizing layer 69 is exposed to light using a fourth photomask and developed so as to expose the protective insulating layer 67 as shown in FIG. 8C. Then, the protective insulating layer 67 is etched using the planarizing layer 69 to form a contact hole so that a part of the drain electrode 65 is exposed.

Next, a pixel electrode 71 is formed in the contact hole. In this embodiment, a conductive layer is formed over the planarizing layer 69, and a resist is applied over the conductive layer. Then, the conductive layer is etched with a resist mask which is formed by photolithography using a fifth photomask to form the pixel electrode 71.

For the pixel electrode 71, a light-transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide in which silicon oxide is added can be used.

Further, the pixel electrode 71 can also be formed using a conductive composition including a conductive macromolecule (also referred to as a conductive polymer). The pixel electrode 71 formed using the conductive composition preferably has a sheet resistance which is less than or equal to 10000 Ω/square and a transmittance which is greater than or equal to 70% at a wavelength of 550 nm. Further, the resistance of the conductive macromolecule included in the conductive composition is preferably less than or equal to 0.1 Ω·cm.

As the conductive macromolecule, a so-called π-electron conjugated conductive macromolecule can be used. For example, polyaniline or a derivative thereof, polypyrrole or a derivative thereof, polythiophene or a derivative thereof, a copolymer of more than two kinds of them, or the like can be given.

In this embodiment, as the pixel electrode 71, an ITO film is formed by a sputtering method and then a resist is applied over the ITO film. Next, the resist is exposed to light and developed using a sixth photomask to form a resist mask. Then, the pixel electrode 71 is formed by etching the ITO film using the resist mask. After that, the resist mask is removed. Note that FIG. 8C corresponds to the cross-sectional views taken along lines A-B and C-D of FIG. 10. Although, in the thin-film transistor shown in FIG. 10, a top view shape of the channel formation region where the source region and the drain region face to each other is a linear shape, a thin-film transistor whose top view shape in the channel formation region is a C (U) shape also be manufactured instead of the thin-film transistor shown in FIG. 10.

In this manner, a thin-film transistor in which the off-state current is low, the on-state current is high, and operation at high speed can be performed can be manufactured. In addition, an element substrate having the thin-film transistor as a switching element of a pixel electrode can be manufactured. Note that in this embodiment, the number of photomasks is increased as compared to a general manufacturing process of an inverted staggered thin-film transistor by one for etching the conductive layer and the buffer layer into predetermined shapes. However, the number of photomasks can be reduced by one in this process because the multi-tone mask is used for the photomasks for etching the amorphous semiconductor layer, the pair of impurity semiconductor layers in which the impurity element imparting one conductivity type is added, and the wiring. Therefore, the number of masks is not increased as is in the whole manufacturing process.

Embodiment 8

Described in this embodiment will be the manufacturing process of a thin-film transistor as shown in FIG. 1B, in which operation at higher speed operation can be performed and the on-state current is higher as compared to a thin-film transistor including an amorphous semiconductor layer for a channel formation region, and the off-state current is lower as compared to a thin-film transistor including a microcrystalline semiconductor layer for a channel formation region.

Figure 11A:
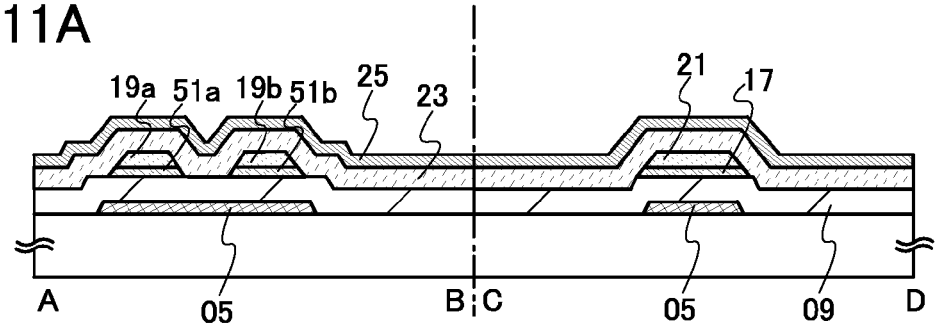
FIGS. 11A to 11E are cross-sectional views describing a manufacturing process of a thin-film transistor according to an embodiment of the present invention.
Figure 11B:
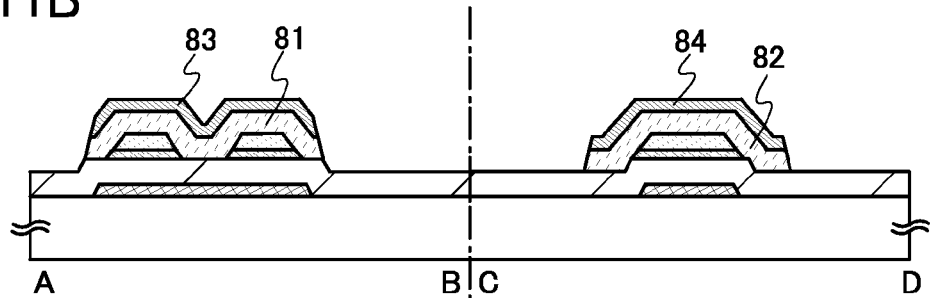
Figure 11C:
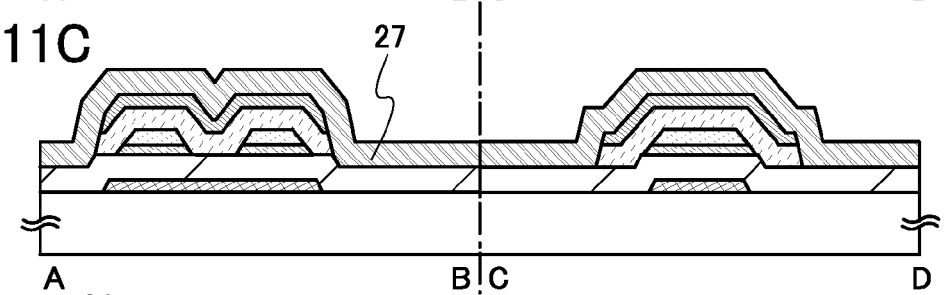
Figure 11D:
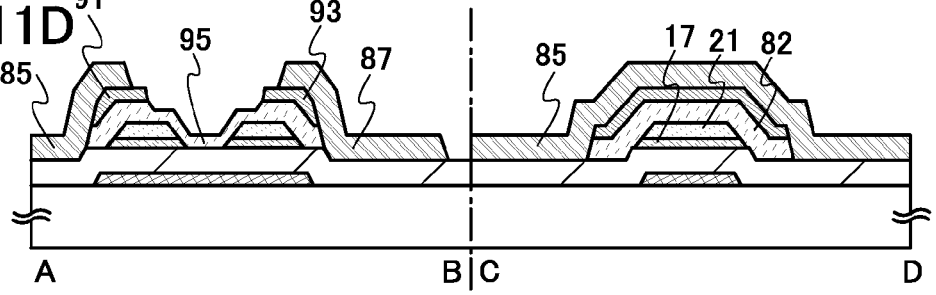
Figure 11E:
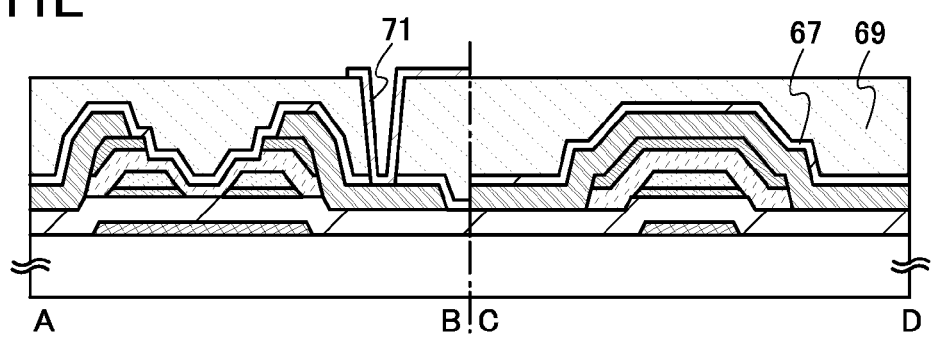
Figure 12:
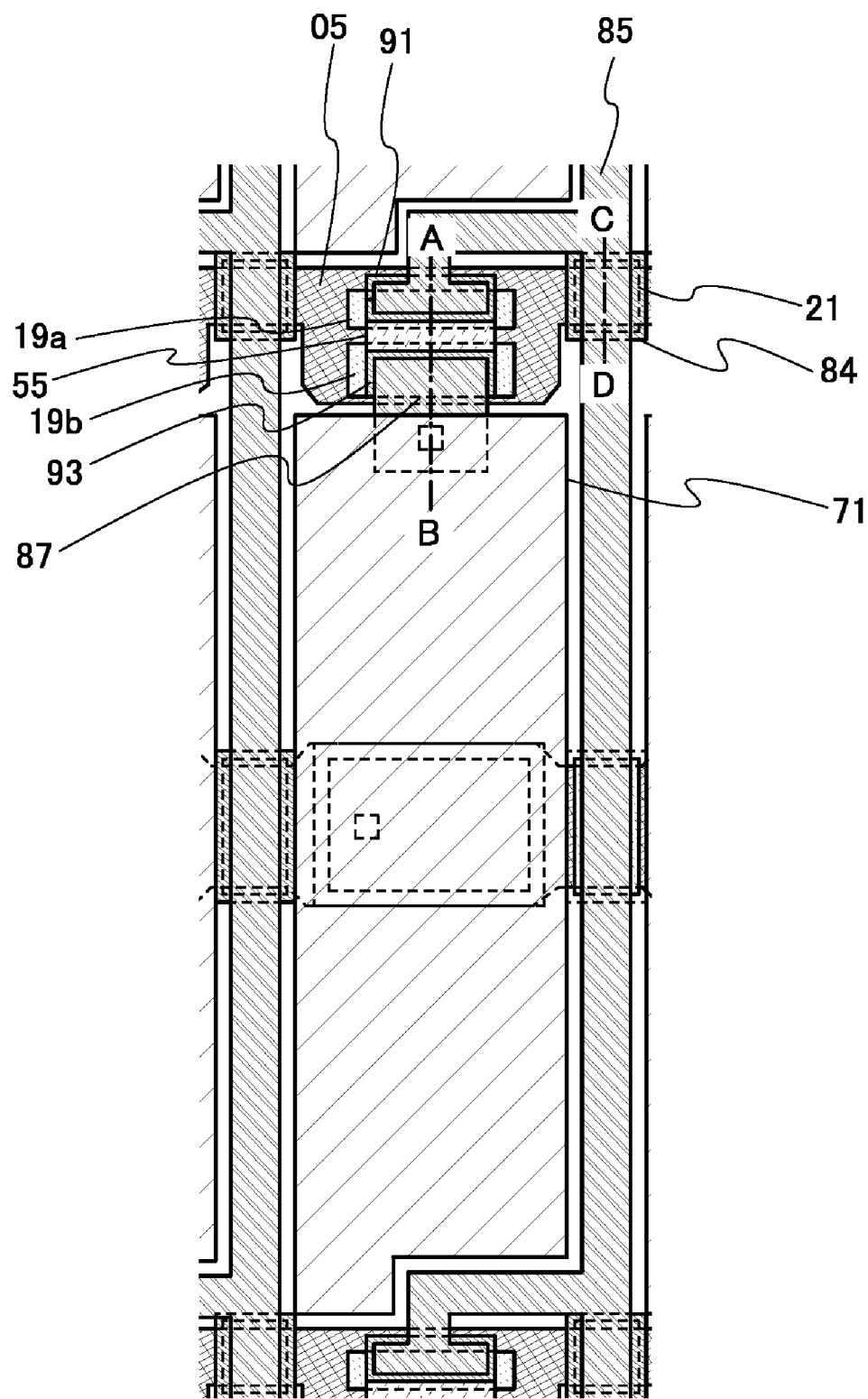
FIG. 12 is a top view describing the manufacturing process of the thin-film transistor according to the embodiment of the present invention.

Note that the left sides of FIGS. 11A to 11E are each a cross-sectional view taken along line A-B of FIG. 12, which illustrates a cross section of a region where the thin-film transistor is formed; and the right sides thereof are each a cross-sectional view taken alone line C-D of FIG. 12, which illustrates a cross section of a region where the gate wiring and the source wiring are intersected to each other in a pixel.

Through the step of FIG. 7A described in Embodiment 7, the gate wiring 05 is formed. Next, the gate insulating layer 09 is formed over the gate wiring 05 and the substrate 01.

Next, through the step of FIG. 7B, the conductive layer 11 and buffer layer 13 are stacked sequentially over the gate insulating layer 09. Then, the conductive layer 11 and the buffer layer 13 are etched using a resist mask formed by photolithography to form the conductive layers 51 and 17 and the buffer layers 19 and 21 as shown in FIG. 11A.

Next, the amorphous semiconductor layer 23 and the impurity semiconductor layer 25 in which the impurity element imparting one conductivity type is added are formed.

Next, the impurity semiconductor layer 25 in which the impurity element imparting one conductivity type is added and the amorphous semiconductor layer 23 are etched into predetermined shapes, using a resist mask formed by photolithography, so that an amorphous semiconductor layer 81 and an impurity semiconductor layer 83 in which the impurity element imparting one conductivity type is added are formed in a region in which a thin-film transistor is formed, as shown in FIG. 11B. In addition, in a region where the gate wiring and the source wiring are intersected to each other, an amorphous semiconductor layer 82 and an impurity semiconductor layer 84 in which the impurity element imparting one conductivity type is added are formed. After that, the resist mask is removed. The side faces of the conductive layers 51 and 17 are covered with the amorphous semiconductor layers 81 and 82.

Next, the conductive layer 27 is formed as shown in FIG. 11C.

Next, the conductive layer 27 is etched into a desired shape using a resist mask formed by photolithography to form a source wiring 85 and a drain electrode 87, as shown in FIG. 11D.

In a portion where the gate wiring 05 and the source wiring 85 are intersected to each other, the conductive layer 17, the buffer layer 21, and the amorphous semiconductor layer 82 are formed in addition to the gate insulating layer 09; and a distance between the gate wiring 05 and the source wiring 85 is increased. Therefore, the parasitic capacitance in the region where the gate wiring 05 and the source wiring 85 are intersected to each other can be reduced.

Next, with the use of the resist mask, the impurity semiconductor layer 83 in which the impurity element imparting one conductivity type is added is etched to form a pair of impurity semiconductor layers 91 and 93 in which the impurity element imparting one conductivity type is added. In this etching step, the amorphous semiconductor layer 81 is also etched. The depressed amorphous semiconductor layer which is partially etched is described as an amorphous semiconductor layer 95. A source and drain regions and the depression of the amorphous semiconductor layer 95 can be formed in the same step. After that, the resist mask is removed.

Next, the exposed amorphous semiconductor layer 95 may be irradiated with $H_2O$ plasma. Typically, the amorphous semiconductor layer 95, the pair of impurity semiconductor layers 91 and 93, and the source wiring 85 and the drain electrode 87 are irradiated with radicals which are generated by plasma discharging of water that is vaporized, so that operation at high speed of the thin-film transistor can be performed and the on-state current can be further increased. Further, the off-state current can be reduced.

Through the steps described above, a thin-film transistor in which operation at high speed can be performed, the on-state current is large, and the off-state current is small is formed.

Next, through the steps shown in FIG. 8B and FIG. 8C, the protective insulating layer 67, the planarizing layer 69, and the pixel electrode 71 which is connected to the drain electrode are formed as shown in FIG. 11E. Note that FIG. 11E corresponds to the cross-sectional views taken along lines A-B and C-D of FIG. 12. Although, in the thin-film transistor shown in FIG. 12, a top view shape of the channel formation region where the source region and the drain region face to each other is a linear shape, a thin-film transistor whose top view shape in the channel formation region is a C (U) shape may also be manufactured instead of the thin-film transistor shown in FIG. 12.

In this manner, a thin-film transistor in which the off-state current is small, the on-state current is large, and operation at high speed can be performed can be manufactured. In addition, an element substrate having the thin-film transistor as a switching element of a pixel electrode can be manufactured.

Embodiment 9

In this embodiment, a channel protective type thin-film transistor will be described using FIG. 29.

Figure 29:
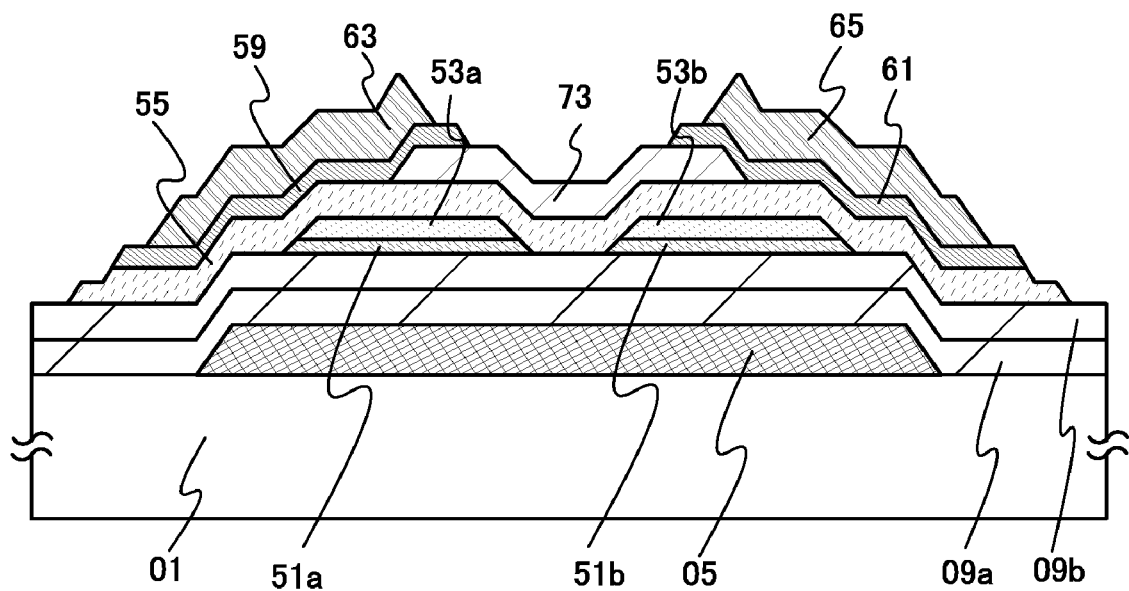
FIG. 29 is a cross-sectional view describing a thin-film transistor according to an embodiment of the present invention.

In a thin-film transistor shown in FIG. 29, a gate electrode 05 is formed over a substrate 01, gate insulating layers 09a and 09b are formed over the gate electrode 05, and a conductive layer 51 is formed over the gate insulating layer 09b. Further, a buffer layer 53 is formed over the conductive layer 51, and an amorphous semiconductor layer 55 is formed over the gate insulating layer 09b and the buffer layer 53. A channel protective layer 73 is formed in a region over the amorphous semiconductor layer 55, which is overlapped with the gate electrode 05 and one of end portions of the conductive layer 51. In addition, a pair of impurity semiconductor layers 59 and 61 in which an impurity element imparting one conductivity type is added is formed over the channel protective layer 73 and the amorphous semiconductor layer 55, and wirings 63 and 65 are formed over the pair of impurity semiconductor layers 59 and 61 in which the impurity element imparting one conductivity type is added.

For the channel protective layer 73, the material of the gate insulating layers 09a and 09b or the material of the planarizing layer 69 can be used as appropriate.

Note that this embodiment can be combined with any of other embodiments.

Embodiment 10

In this embodiment, a structure of a scanning line input terminal portion and a signal line input terminal portion which are provided in the peripheral portion of an element substrate 300 shown in FIG. 13 will be described using FIGS. 14A and 14B. FIGS. 14A and 14B are cross-sectional views of a scanning line input terminal portion and a signal line input terminal portion which are provided in the peripheral portion of a substrate 01, and a thin-film transistor of a pixel portion.

Note that in the case of an active matrix display device provided with a thin-film transistor for controlling the potential of a pixel electrode in a pixel provided in a pixel portion, a scanning line is connected to a gate electrode, or a part of the scanning line functions as the gate electrode. Therefore, the scanning line is also referred to as a gate wiring 05. In addition, a signal line is connected to a source of the thin-film transistor; therefore, the signal line is also referred to as a source wiring 63. However, when the signal line is connected to a drain of the thin-film transistor, the signal line can serve as a drain wiring.

Figure 13:
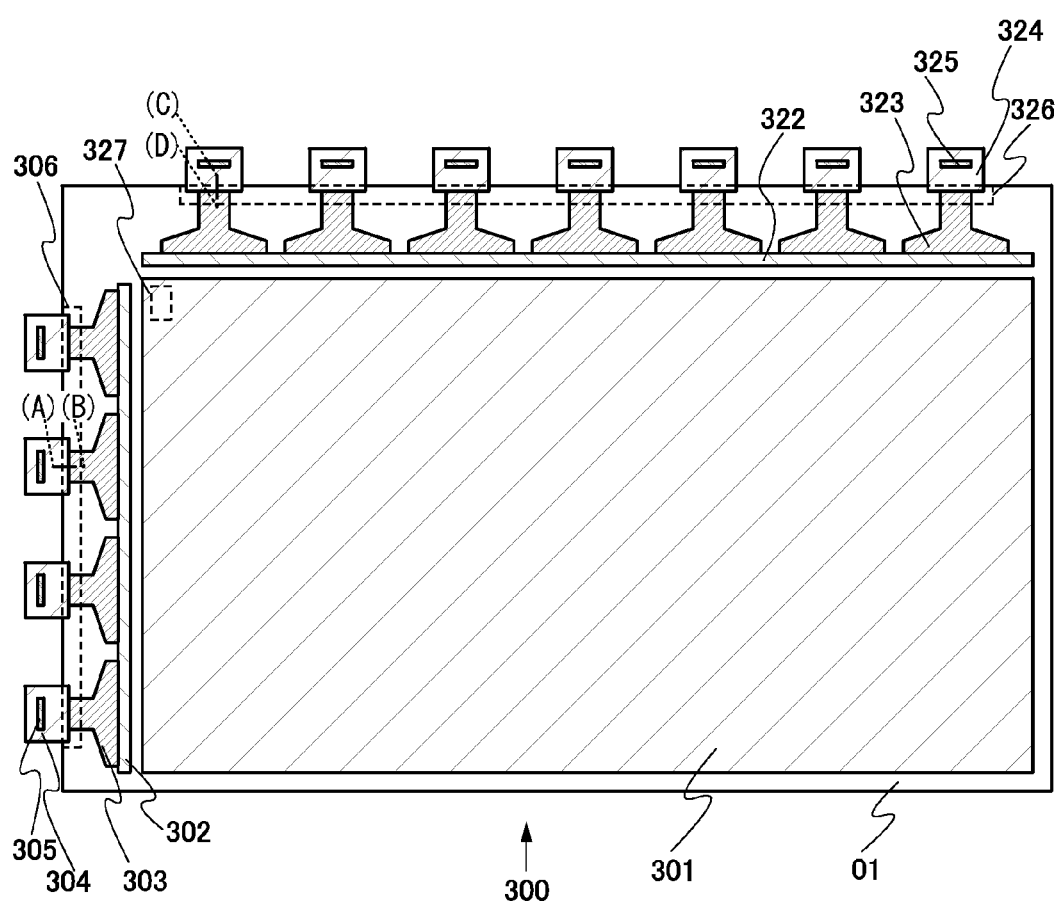
FIG. 13 is a plan view describing an element substrate according to an embodiment of the present invention.
Figure 14A:
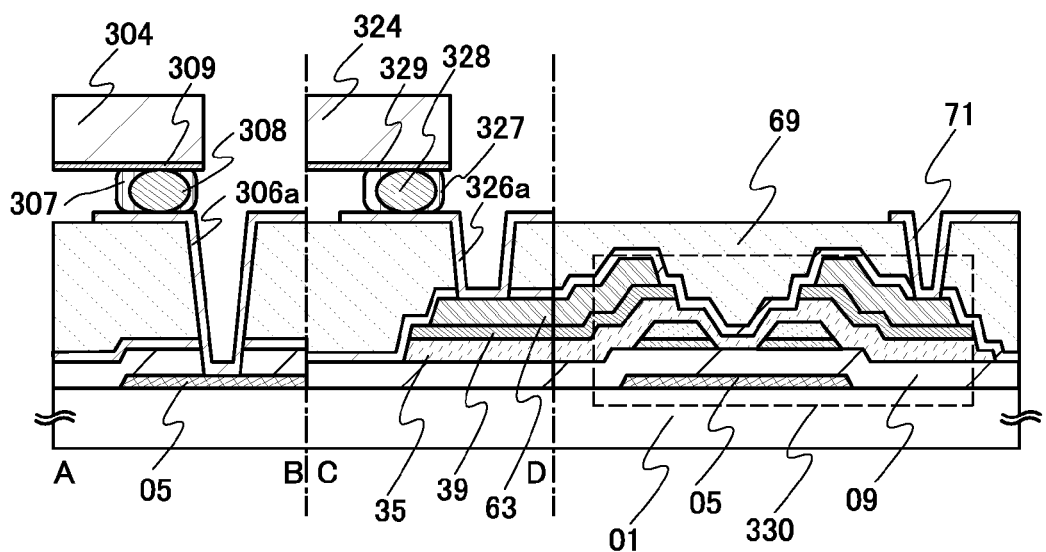
FIGS. 14A and 14B are cross-sectional views each describing a terminal portion and a pixel portion of the element substrate according to the embodiment of the present invention.
Figure 14B:
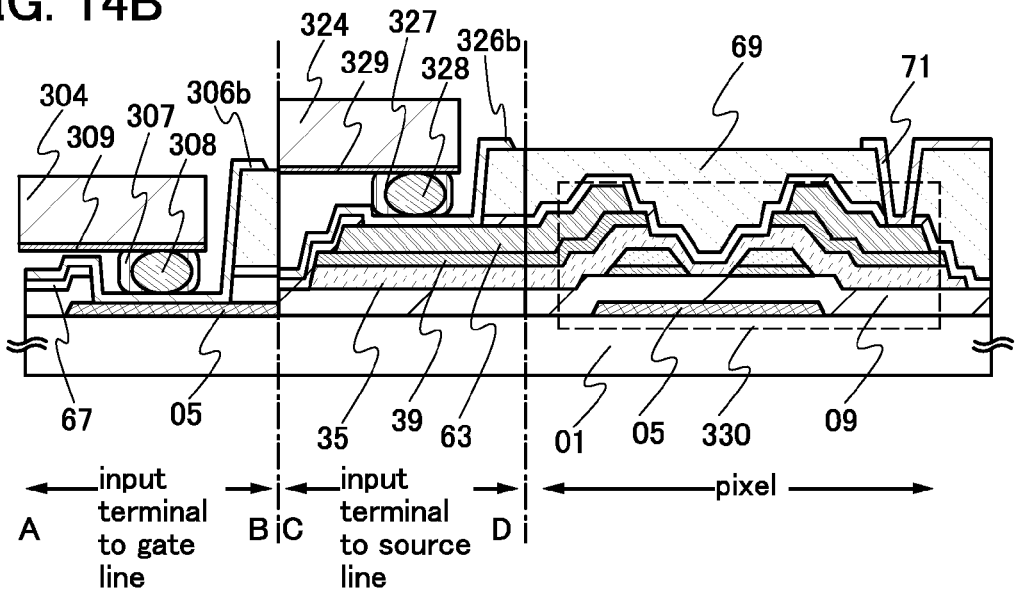

The element substrate 300 shown in FIG. 13 is provided with a pixel portion 301, and protective circuits 302 and 322, a signal line 323, and a scanning line 303 are provided between the pixel portion 301 and the peripheral portion of the substrate 01. In addition, although not shown, a signal line and a scanning line are formed from the protective circuits 302 and 322 to the pixel portion 301. A signal line input terminal portion 326 and a scanning line input terminal portion 306 are provided at the end portion of the signal line 323 and the end portion of the scanning line 303, respectively. An FPC 324 and an FPC 304 are connected to the terminal of the signal line input terminal portion 326 and the terminal of the scanning line input terminal portion 306, respectively, and a signal line driver circuit 325 and a scanning line driver circuit 305 are provided for the FPC 324 and the FPC 304, respectively. In addition, although not shown, pixels 327 are arranged in matrix in the pixel portion 301.

In FIG. 14A, a scanning line input terminal 306a is connected to the gate wiring 05 of a thin-film transistor 330. In addition, a signal line input terminal 326a is connected to the source wiring 63.

The scanning line input terminal 306a and the signal line input terminal 326a are each formed using the same layer used for a pixel electrode 71 of the thin-film transistor 330 in the pixel portion. In addition, the scanning line input terminal 306a and the signal line input terminal 326a are formed over the planarizing layer 69 which is formed over the source wiring 63. In addition, over the planarizing layer 69, the scanning line input terminal 306a and the signal line input terminal 326a are connected to a wiring 309 and a wiring 329 of the FPC 304 and the FPC 324, respectively, with respective conductive particles 308 and 328 of anisotropy conductive adhesives 307 and 327 interposed therebetween.

Note that although the gate wiring 05 and the scanning line input terminal 306a are connected in this embodiment, a conductive layer formed using the same layer used for the source wiring 63 may be provided between the gate wiring 05 and the scanning line input terminal 306a.

In FIG. 14B, a scanning line input terminal 306b is connected to the gate wiring 05 of the thin-film transistor 330. In addition, a signal line input terminal 326b is connected to the source wiring 63 of the thin-film transistor 330.

The scanning line input terminal 306b and the signal line input terminal 326b are each formed using the same layer used for the pixel electrode 71 of the thin-film transistor 330 in the pixel portion. In addition, the scanning line input terminal 306b and the signal line input terminal 326b are formed over a planarizing layer 69 and a protective insulating layer 67. In addition, in openings of the planarizing layer 69 and the protective insulating layer 67, the scanning line input terminal 306b and the signal line input terminal 326b are connected to the wiring 309 and the wiring 329 of the FPC 304 and the FPC 324, respectively, with the respective conductive particles 308 and 328 of the anisotropy conductive adhesives 307 and 327 interposed therebetween.

The thickness of the signal line input terminal 326b which is connected to the source wiring 63 is increased because the amorphous semiconductor layer 35 and the impurity semiconductor layer 39 in which the impurity element imparting one conductivity type is added are formed in addition to the gate insulating layer 09 between the substrate 01 and the source wiring 63. Therefore, the signal line input terminal 326b and the wiring 328 of the FPC 324 are easily connected to each other.

Embodiment 11

Next, the structure of a display panel which is one embodiment of the present invention will be described.

Figure 15A:
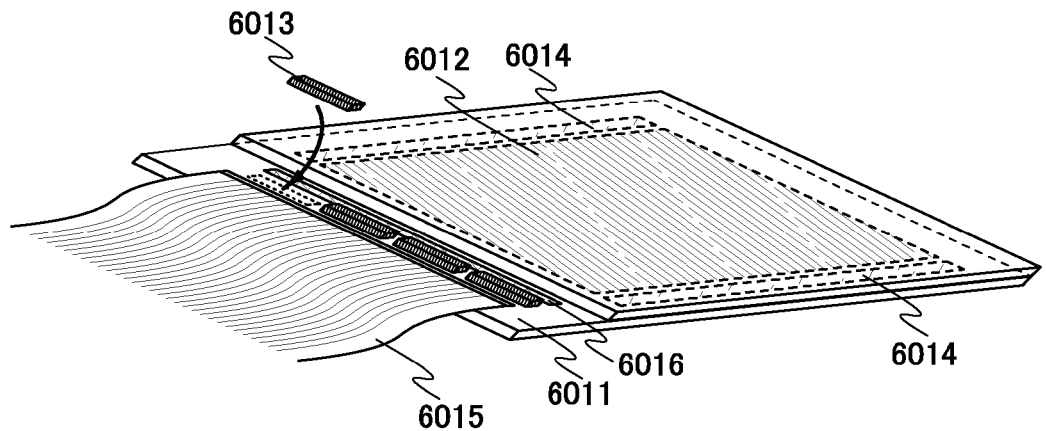
FIGS. 15A to 15C are perspective views each describing a display panel according to an embodiment of the present invention.

FIG. 15A illustrates an embodiment of a display panel in which a pixel portion 6012 formed over a substrate 6011 is connected to a signal line driver circuit 6013 which is formed separately. An element substrate over which the pixel portion 6012, a protection circuit 6016, and a scanning line driver circuit 6014 are formed is formed using the element substrate described in the above-described embodiment. By forming the signal line driver circuit using a thin-film transistor which has higher field-effect mobility than the thin-film transistor in which an amorphous semiconductor layer is used for the channel formation region, an operation of the signal line driver circuit which demands higher driving frequency than the scanning line driver circuit can be stabilized. Note that the signal line driver circuit 6013 may be formed using a transistor using a single crystalline semiconductor for a channel formation region, a thin-film transistor using a polycrystalline semiconductor for a channel formation region, or a transistor using SOI for a channel formation region. The transistor using SOI may include in its category a transistor using a single crystalline semiconductor layer provided on a glass substrate, for a channel formation region. The pixel portion 6012, the signal line driver circuit 6013, and the scanning line driver circuit 6014 are each supplied with potential of a power source, various signals, and the like via an FPC 6015. Between the signal line driver circuit 6013 and the FPC 6015, or between the signal line driver circuit 6013 and the pixel portion 6012, the protection circuit 6016 formed using the thin-film transistor described in the above-described embodiment may be provided. The protection circuit 6016 may be provided using one or a plurality of elements selected from a thin-film transistor, a diode, a resistor, a capacitor, and the like instead of the thin-film transistor described in above-described embodiment.

The signal line driver circuit and the scanning line driver circuit may both be formed over the same substrate as the substrate where the pixel portion is provided.

Figure 15B:
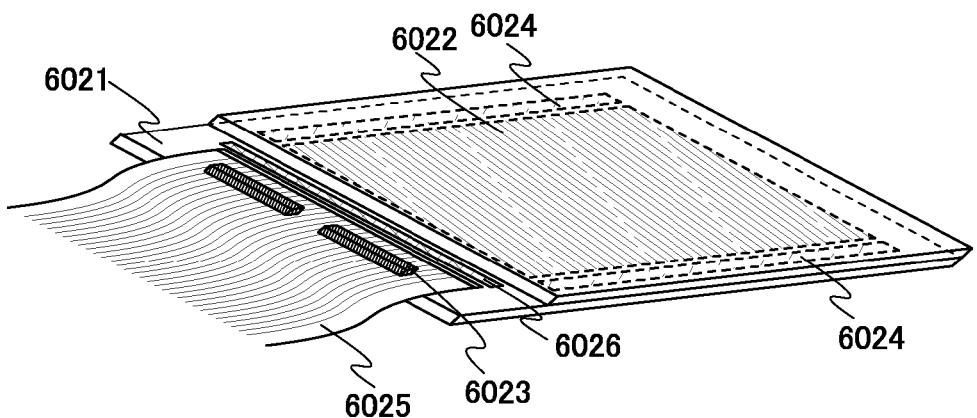

When the driver circuit is separately formed, a substrate provided with the driver circuit is not necessarily attached to a substrate provided with the pixel portion; for example, the substrate provided with the driver circuit may be attached onto the FPC. FIG. 15B illustrates an embodiment of a panel of a display device in which a signal line driver circuit 6023 is formed separately and an FPC is connected to an element substrate where a pixel portion 6022, a protection circuit 6026, and a scanning line driver circuit 6024 are formed over a substrate 6021. The pixel portion 6022, the protection circuit 6026, and the scanning line driver circuit 6024 each are formed using the thin-film transistor described in the above-described embodiment. The signal line driver circuit 6023 is connected to the pixel portion 6022 via an FPC 6025 and the protection circuit 6026. The pixel portion 6022, the signal line driver circuit 6023, and the scanning line driver circuit 6024 are each supplied with potential of a power source, various signals, and the like via the FPC 6025. The protection circuit 6026 which is formed using the thin-film transistor described in the above-described embodiment may be provided between the FPC 6025 and the pixel portion 6022. The protection circuit 6026 may be provided using one or a plurality of elements selected from a thin-film transistor, a diode, a resistor, a capacitor, and the like instead of the thin-film transistor described in above-described embodiment.

Figure 15C:
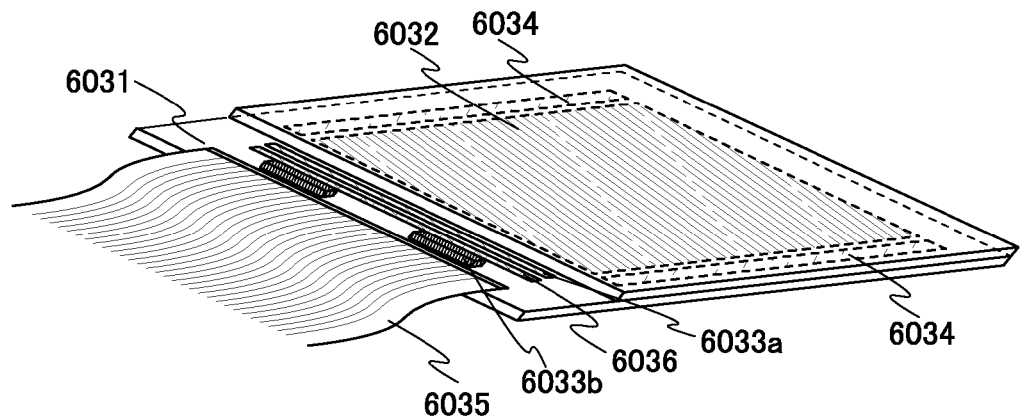

Furthermore, only a part of the signal line driver circuit or only a part of the scanning line driver circuit may be formed over the same substrate as the substrate where the pixel portion is provided, using the thin-film transistor described in the above-described embodiment, and the rest of the signal line driver circuit and the scanning line driver circuit which are not formed over the substrate may be formed separately and electrically connected to the pixel portion. FIG. 15C illustrates an embodiment of a panel of a display device in which an analog switch 6033a included in the signal line driver circuit is formed over a substrate 6031 which is the same as the substrate over which a pixel portion 6032 and a scanning line driver circuit 6034 are formed, and a shift register 6033*b* included in the signal line driver circuit is formed separately over a substrate and then attached to the substrate 6031. The pixel portion 6032, a protection circuit 6036, and the scanning line driver circuit 6034 each are formed using the thin-film transistor described in the above-described embodiment. The shift register 6033*b* included in the signal line driver circuit is connected to the pixel portion 6032 via an FPC 6035 and the protection circuit 6036. The pixel portion 6032, the signal line driver circuit 6033, and the scanning line driver circuit 6034 are each supplied with potential of a power source, various signals, and the like via the FPC 6035. The protection circuit 6036 which is formed using the thin-film transistor described in the above-described embodiment may be provided between the shift register 6033*b* and the analog switch 6033*a*. The protection circuit 6036 may be provided using one or a plurality of elements selected from a thin-film transistor, a diode, a resistor, a capacitor, and the like instead of the thin-film transistor described in above-described embodiment.

As shown in FIGS. 15A to 15C, in the display device of this embodiment, the driver circuitry can be partly or entirely formed over the same substrate as the substrate where the pixel portion is provided, using the thin-film transistor described in the above-described embodiment.

Note that there are no particular limitation on the connection method of a separately formed substrate; a known method such as a COG method, a wire bonding method, or a TAB method can be used. Further, the connection position is not limited to the position shown in FIGS. 15A to 15C as long as electrical connection is possible. A controller, a CPU, a memory, or the like may be formed separately and connected.

The signal line driver circuit used in this embodiment includes a shift register and an analog switch. In addition to the shift register and the analog switch, another circuit such as a buffer, a level shifter, or a source follower may be included. The shift resister and the analog switch are not necessarily provided; for example, another circuit such as a decoder circuit for selecting a signal line may be used instead of the shift resister, and a latch or the like may be used instead of the analog switch.

Embodiment 12

The element substrate according to the above-described embodiment, or a display device or the like using the element substrate can be used for an active matrix display device panel. That is the above-described embodiment can be implemented in any electronic device having a display portion in which any of them is incorporated.

Examples of such an electronic device are cameras such as a video camera and a digital camera, a head-mounted display (a goggle-type display), a car navigation system, a projector, a car stereo, a personal computer, a portable information terminal (e.g., a mobile computer, a mobile phone, or an e-book reader), and the like. Examples of these are illustrated in FIGS. 16A to 16D.

Figure 16A:
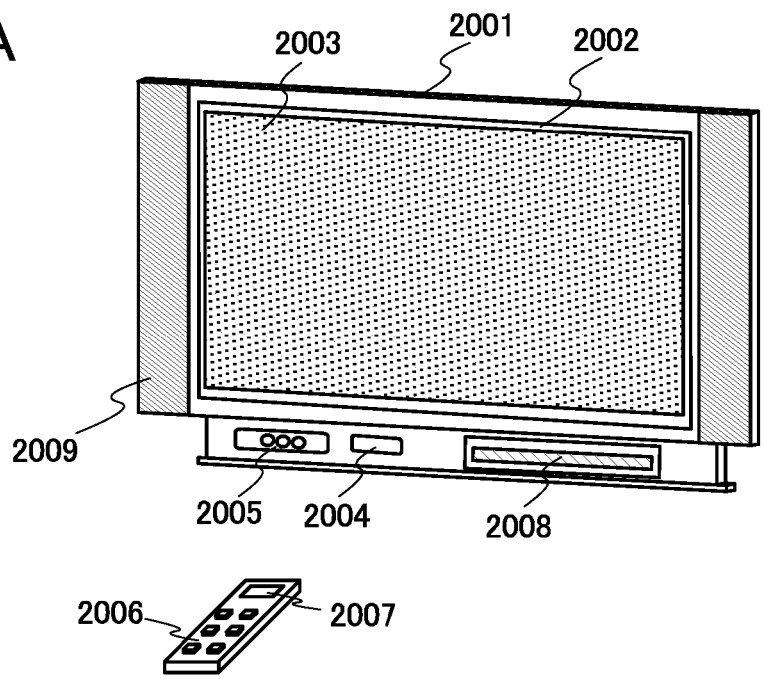
FIGS. 16A to 16D are perspective views illustrating electronic devices each using a display device according to an embodiment of the present invention.

FIG. 16A illustrates a television device. The television device can be completed by incorporating a display panel into a housing as shown in FIG. 16A. A main screen 2003 is formed using the display panel, and other accessories such as a speaker portion 2009 and an operation switch are provided. In this manner, the television device can be completed.

As shown in FIG. 16A, a display panel 2002 using a display element is incorporated in a housing 2001. With the use of a receiver 2005, in addition to reception of general TV broadcast, communication of information can also be performed in one way (from transmitter to receiver) or in two ways (between transmitter and receiver or between receivers) by connection to a wired or wireless communication network through a modem 2004. Operation of the television device can be carried out using switches that are incorporated into the housing or by a remote control device 2006 provided separately. A display portion 2007 for displaying information to be output may be provided for the remote control device 2006.

Further, the television device may include a sub-screen 2008 formed using a second display panel for displaying channels, sound volume, and the like, in addition to the main screen 2003. In this structure, the main screen 2003 may be formed using a liquid crystal display panel, and the sub-screen 2008 may be formed using a light-emitting display panel. Alternatively, the main screen 2003 may be formed using a light-emitting display panel, and the sub-screen 2008 may be formed using a light-emitting display panel such that the sub-screen 2008 repeats on and off.

Figure 17:
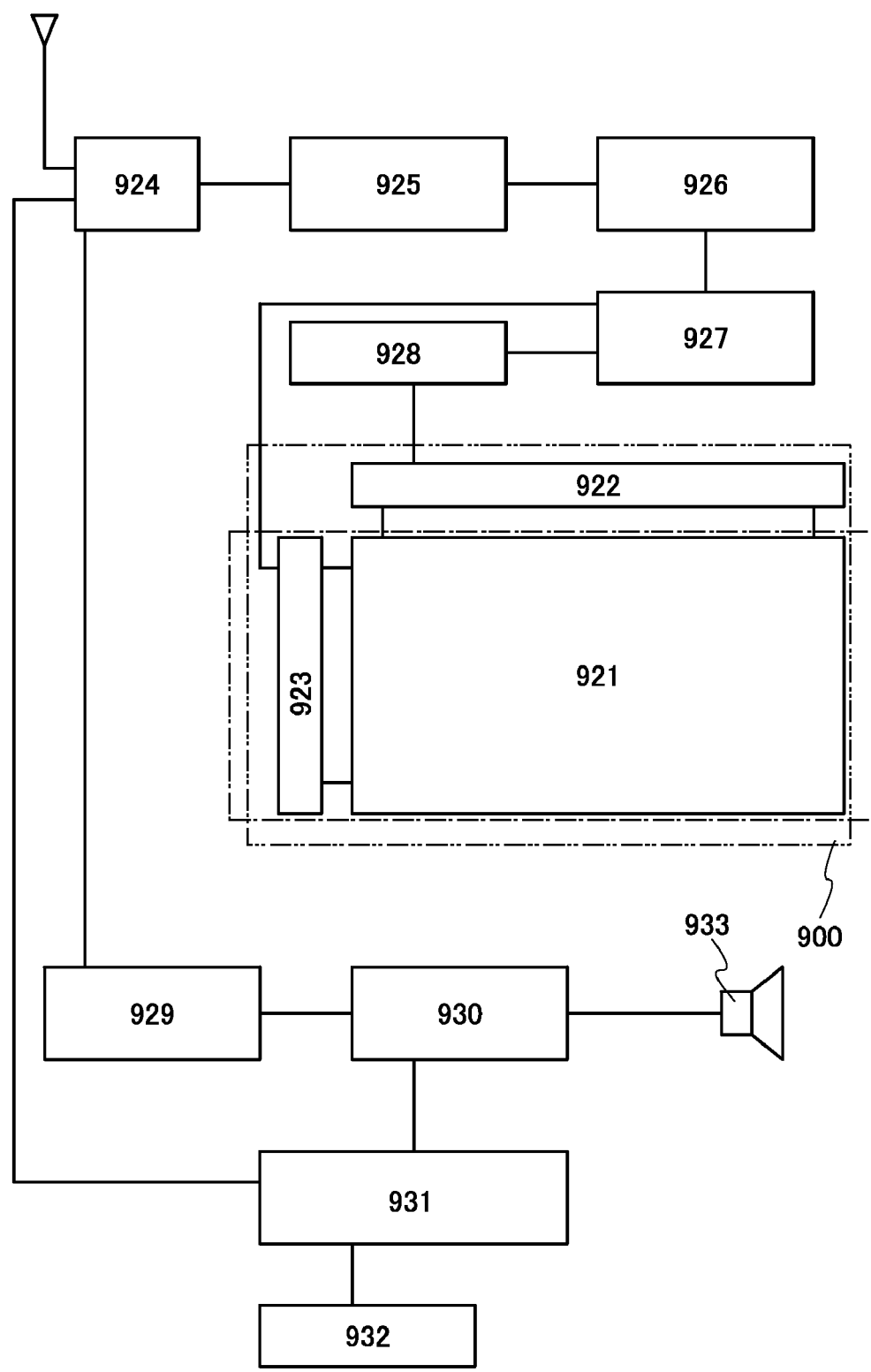
FIG. 17 is a view describing the electronic device using the display device according to the embodiment of the present invention.

FIG. 17 is a block diagram showing a main structure of the television device. A display panel 900 is provided with a pixel portion 921. A signal line driver circuit 922 and a scanning line driver circuit 923 may be mounted on the display panel 900 by a COG method.

As for other external circuits, the television device has, on the video signal input side, a video signal amplifier circuit 925 for amplifying a video signal among signals received by a tuner 924; a video signal processing circuit 926 for converting a signal output from the video signal amplifier circuit 925 into a color signal corresponding to each color of red, green, and blue; a control circuit 927 for converting the video signal into an input specification of a driver IC; and the like. The control circuit 927 outputs signals to each of the scanning line side and the signal line side. When digital driving is performed, a signal dividing circuit 928 may be provided on the signal line side such that an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

The present invention is not limited to the television set, and can be applied to various uses particularly as a large display medium such as an information display board at a train station, an airport, or the like, or an advertisement display board on the street as well as a monitor of a personal computer.

The element substrate described in the above-described embodiment, or the display device including the element substrate is applied to the main screen 2003 and the sub-screen 2008, so that mass productivity of the television device with improved image quality such as contrast can be improved.

Figure 16B:
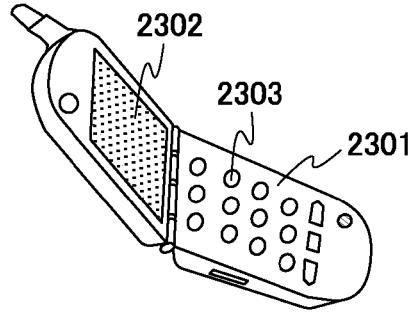

FIG. 16B illustrates a mobile phone 2301. This mobile phone 2301 includes a display portion 2302, operation switches 2303, and the like. The element substrate described in the above-described embodiment, or the display device including the element substrate is applied to the display portion 2302, so that mass productivity of the mobile phone with improved image quality such as contrast can be improved.

Figure 16C:
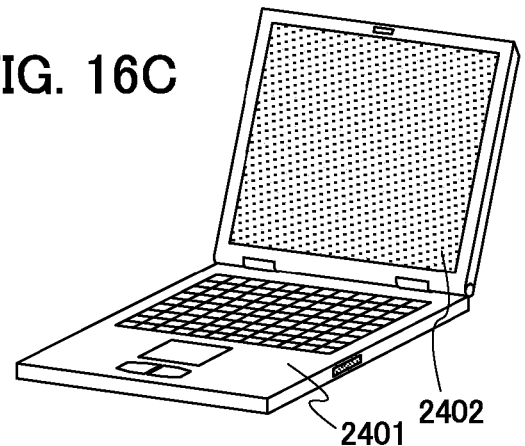

A portable computer illustrated in FIG. 16C includes a main body 2401, a display portion 2402, and the like. The element substrate described in the above-described embodiment, or the display device including the element substrate is applied to the display portion 2402, so that mass productivity of the computer with improved image quality such as contrast can be improved.

Figure 16D:
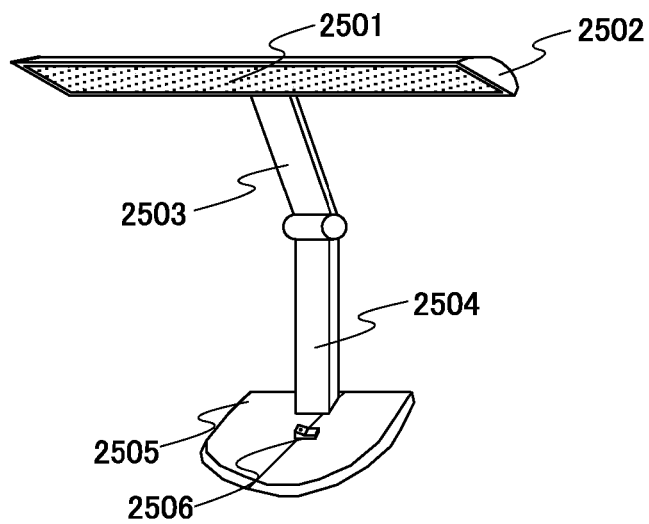

FIG. 16D illustrates a desk lamp including a lighting portion 2501, a shade 2502, an adjustable arm 2503, a support 2504, a base 2505, and a power supply switch 2506. The desk lamp can be manufactured by applying a light-emitting device to the lighting portion 2501. The lamp includes in its category ceiling lamps, wall-hanging lamps, and the like. The element substrate described in the above-described embodiment, or the display device including the element substrate is applied, so that mass productivity can be improved and inexpensive desk lamps can be provided.

Figure 18A:
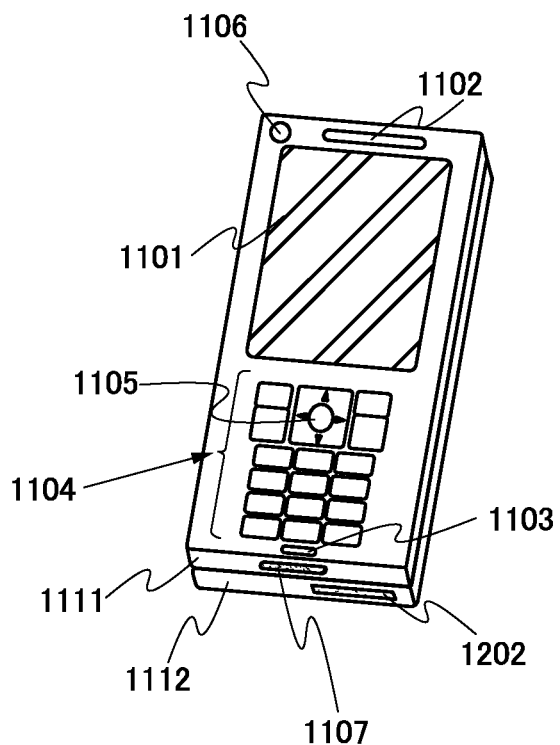
FIGS. 18A to 18C are perspective views illustrating an electronic device using the display device according to the embodiment of the present invention.
Figure 18B:
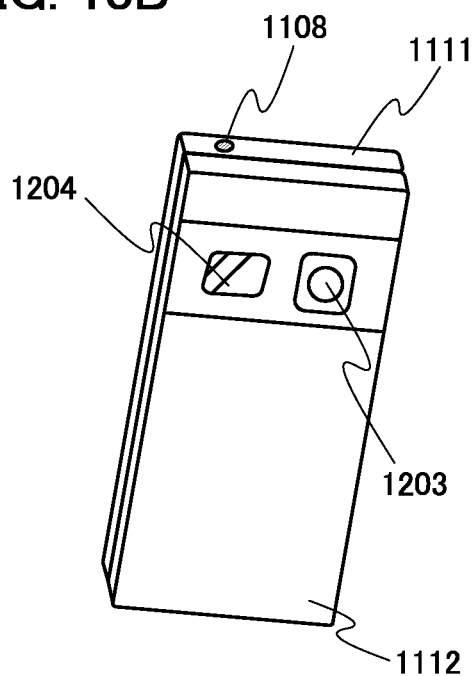
Figure 18C:
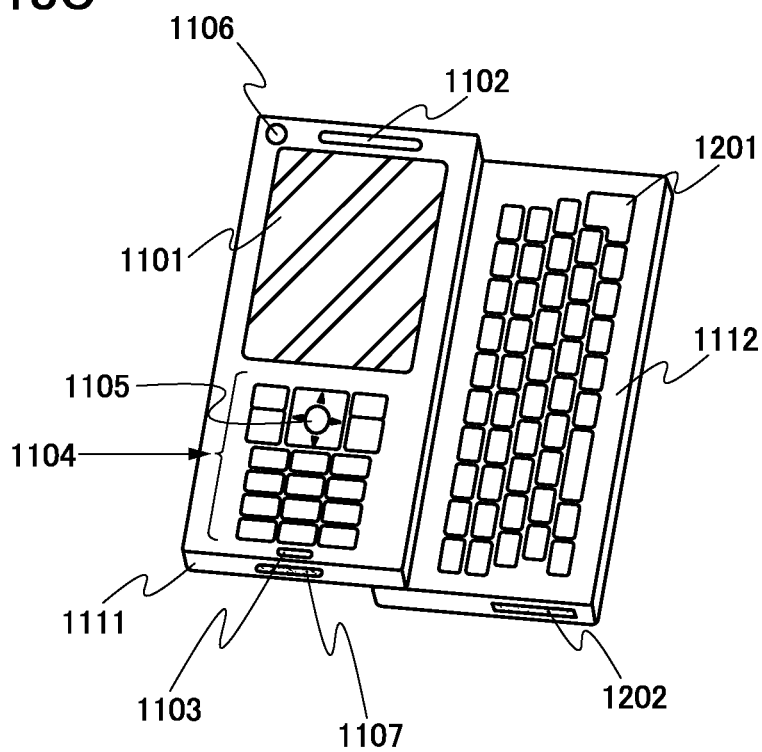

FIGS. 18A to 18C illustrate an example of the structure of a smartphone to which the above-described embodiment is applied. FIG. 18A is a front view, FIG. 18B is a rear view, and FIG. 18C is a development view. The smartphone includes two housings 1111 and 1112. The smartphone has both a function of a mobile phone and a function of a portable information terminal, and incorporates a computer provided to conduct a variety of data processing in addition to verbal communication.

The housing 1111 includes a display portion 1101, a speaker 1102, a microphone 1103, an operation key 1104, a pointing device 1105, a front camera lens 1106, a jack 1107 for an external connection terminal, an earphone terminal 1108, and the like. The housing 1112 includes a keyboard 1201, an external memory slot 1202, a rear camera 1203, a light 1204, and the like. In addition, an antenna is incorporated in the housing 1111.

Further, in addition to the above structure, the smartphone may incorporate a non-contact IC chip, a small size memory device, or the like.

The housing 1111 and housing 1112 which are folded (FIG. 18A) are slide aside as shown in FIG. 18C. The display device described in the above-described embodiment can be incorporated in the display portion 1101, and the display direction is changed depending on a use mode. Because the front camera lens 1106 is provided in the same plane as the display portion 1101, the smartphone can be used as a videophone. A still image and a moving image can be taken by the rear camera 1203 and the light 1204 by using the display portion 101 as a viewfinder.

The speaker 1102 and the microphone 1103 are not limited to use for verbal communication, and can be used for a videophone, recording, reproduction, and the like. With use of the operation key 1104, operation of incoming and outgoing calls, simple information input of electronic mails or the like, scrolling of a screen, cursor motion, and the like can be carried out.

If much information is treated, such as documentation or use as a portable information terminal, it is convenient to use the keyboard 1201. When the housing 1111 and the housing 1112 which are folded (FIG. 18A) are slide aside as shown in FIG. 18C and the smartphone is used as a portable information terminal, smooth operation can be conducted by using the keyboard 1201 and the pointing device 1105. The jack 709 for an external connection terminal can be connected to an AC adapter or a cable such as a USB cable, and charging and data communication with a personal computer or the like is possible. Moreover, a large amount of data can be stored by inserting a storage medium into the external memory slot 1202 and can be moved.

On the rear surface of the housing 1112 (FIG. 18B), the rear camera 1203 and the light 1204 are provided, and a still image and a moving image can be taken by using the display portion 1101 as a viewfinder.

Further, the smartphone may have an infrared communication function, a USB port, a function of receiving one segment television broadcast, a non-contact IC chip, an earphone jack, or the like, in addition to the above-described function structure.

The display device described in the above-described embodiment is applied, so that mass productivity can be improved.

EXAMPLE 1

In this example, results of simulation of a current vs. voltage characteristic of the thin-film transistor described in the above embodiment will be described. For the device simulation, the device simulator, ATLAS made by Silvaco Data Systems Inc. was used.

Figure 19:
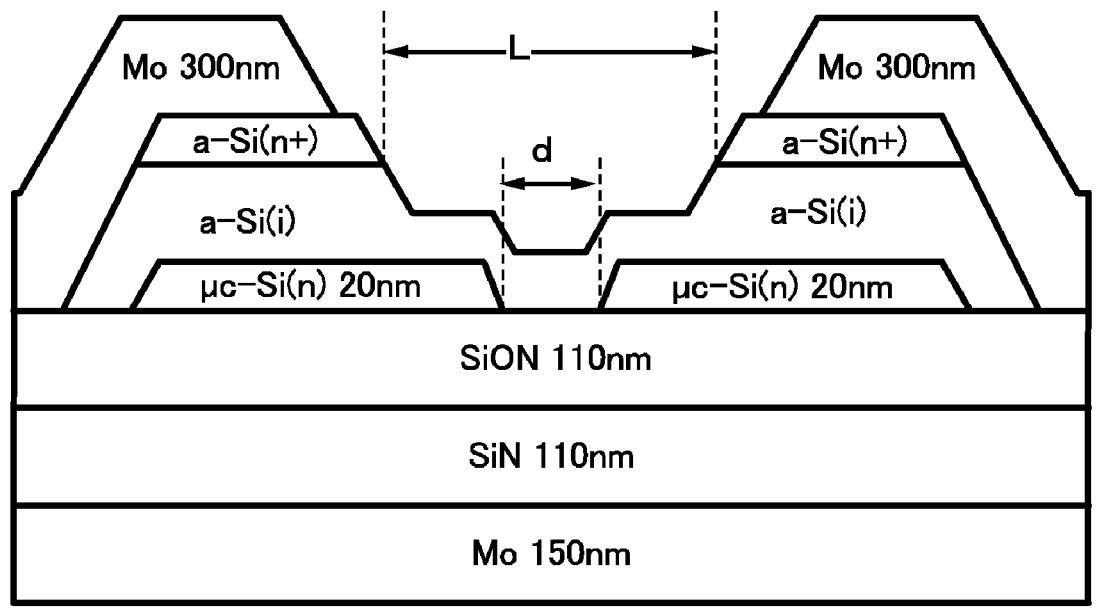
FIG. 19 is a diagram describing a structure for device simulations in Example 1.

FIG. 19 shows the structure of the thin-film transistor used for the device simulation.

Over an insulating substrate, molybdenum (Mo) was stacked with a thickness of 150 nm as a gate electrode. The work function of molybdenum (Mo) was supposed to be 4.6 eV.

A silicon nitride film (with a dielectric constant of 7.0 and a thickness of 110 nm) and a silicon oxynitride film (with a dielectric constant of 4.1 and a thickness of 110 nm) were stacked as a gate insulating layer over the gate electrode.

A microcrystalline silicon layer in which phosphorus is added, μc-Si(n) (the thickness is 20 nm) was stacked as each of a pair of semiconductor layers in which an impurity element serving as a donor is added, over the gate insulating layer. Over the pair of semiconductor layers in which the impurity element serving as a donor was added and the gate insulating layer, an amorphous silicon layer a-Si(i) (the thickness is 80 nm) was stacked as an amorphous semiconductor layer. The amorphous semiconductor layer serves as a channel-etch layer; hence, the amorphous semiconductor layer had a depression, and the thickness at the depression was 40 nm.

Over the amorphous semiconductor layer, an amorphous silicon layer in which phosphorus is added, a-Si(n$^+$) (the thickness is 50 nm) was stacked as each of a pair of semiconductor layers in which an impurity element imparting one conductivity type is added. In FIG. 19, the distance between the amorphous silicon layers in which phosphorus was added, a-Si(n$^-$) corresponds to a channel length L of the thin-film transistor. In this example, the channel length L was set to be 10 μm. In addition, the distance between the pair of microcrystalline silicon layers μc-Si(n) in which phosphorus was added is denoted by d. The donor concentration of each amorphous silicon layer a-Si(n$^+$) in which phosphorus is added was set to $1 \times 10^{19}$ atoms/cm$^3$; thus, the electrical conductivity of a-Si(n$^+$) is high.

Over the pair of semiconductor layers in which the impurity element imparting one conductivity type was added, molybdenum (Mo) (the thickness is 300 nm) was stacked as each of a source and drain electrodes. It was assumed that the contact between the molybdenum (Mo) and each amorphous silicon layer a-Si(n$^+$) in which phosphorus was added was ohmic contact.

Described hereinafter in this example are results of device simulation of current vs. voltage characteristic of the thin-film transistor with respect to the donor concentration and the distance d of the pair of microcrystalline silicon layers μc-Si (n) in which phosphorus is added.

Figure 20:
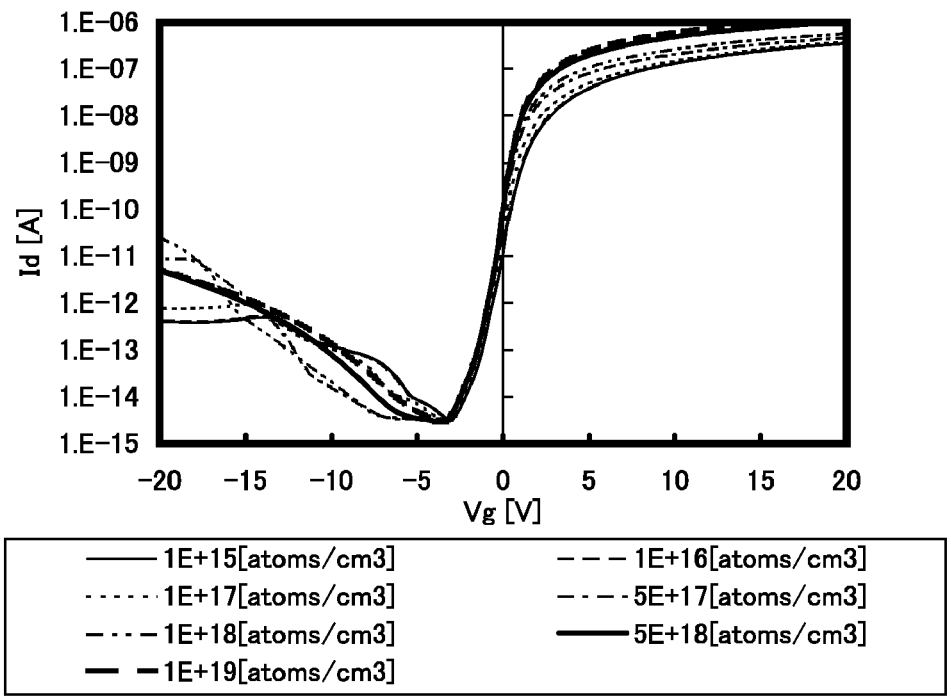
FIG. 20 is a graph showing current vs. voltage characteristics obtained from the device simulation.
Figure 21:
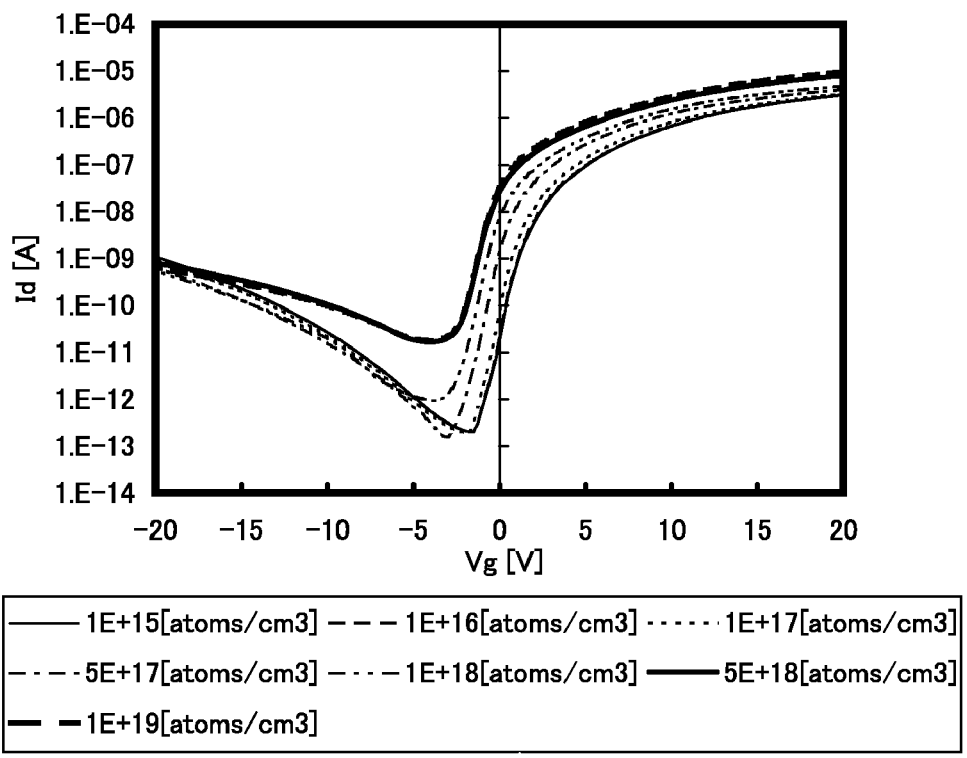
FIG. 21 is a graph showing current vs. voltage characteristics obtained from the device simulation.

FIG. 20 shows respective current vs. voltage curves of the thin-film transistors when the distance d is 1 μm and the drain voltage Vd is 1 V. FIG. 21 shows respective current vs. voltage curves of the thin-film transistors when the distance d is 1 μm and the drain voltage Vd is 10 V.

Figure 22:
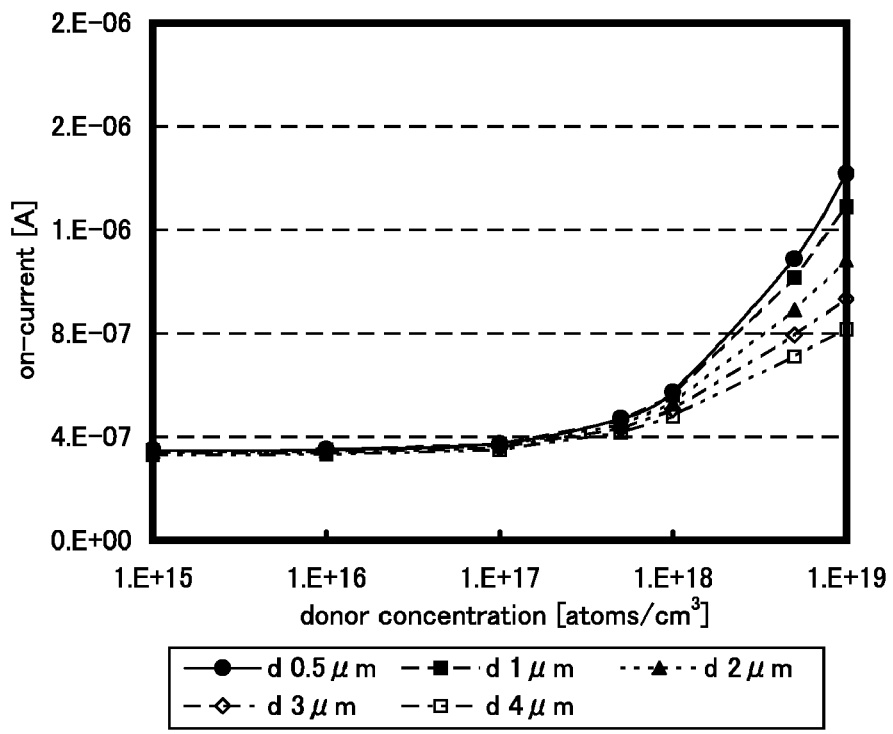
FIG. 22 is a graph showing ON-state currents obtained from the device simulation.
Figure 23:
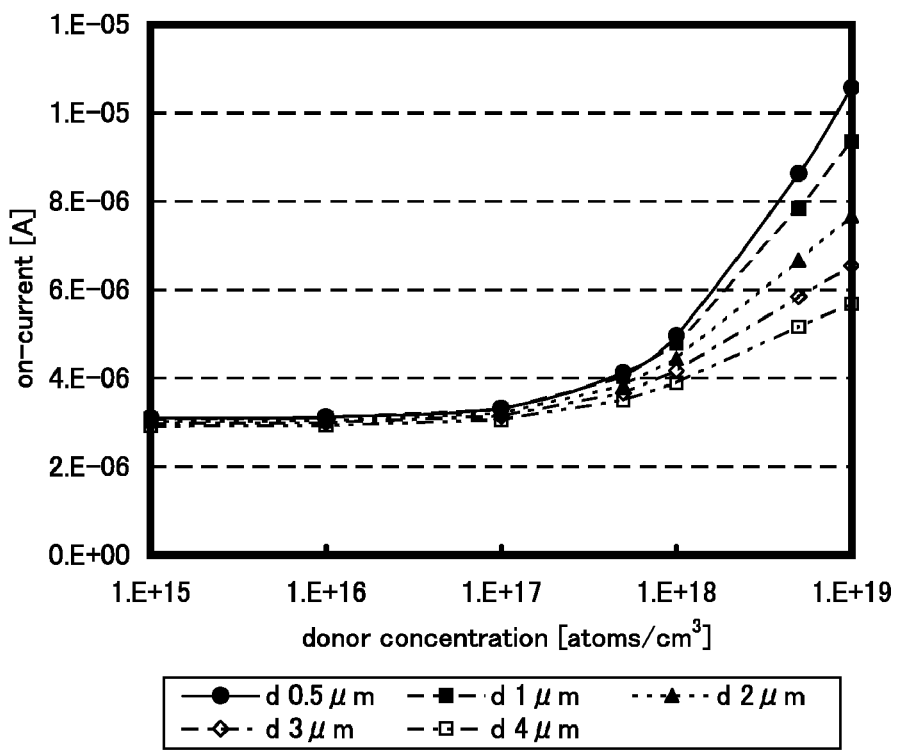
FIG. 23 is a graph showing ON-state currents obtained from the device simulation.

FIG. 22 shows change of on-current with respect to the donor concentration when the drain voltage Vd is 1 V, depending on the distance d of the pair of microcrystalline silicon layers μc-Si(n) in which phosphorus is added. FIG. 23 shows change of on-current with respect to the donor concentration when the drain voltage Vd is 10 V, depending on the distance d of the pair of microcrystalline silicon layers μc-Si(n) in which phosphorus is added.

Figure 24:
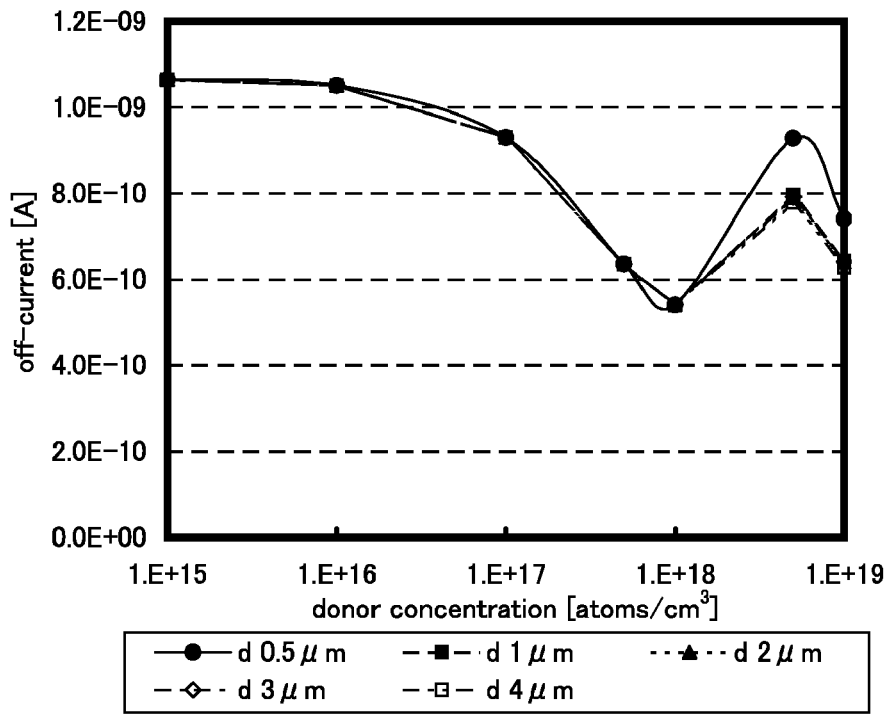
FIG. 24 is a graph showing OFF-state currents obtained from the device simulation.
Figure 25:
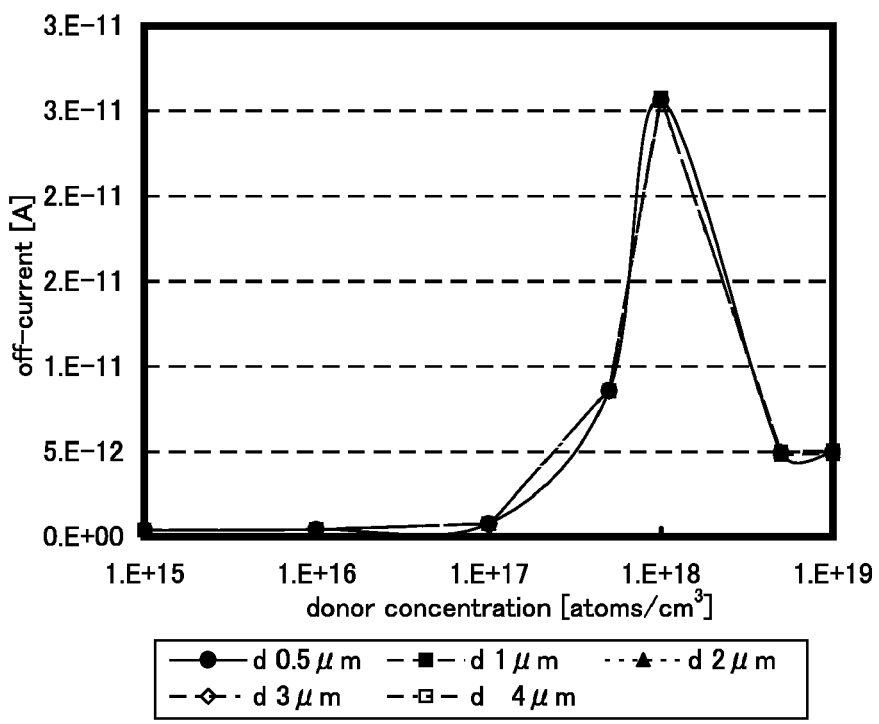
FIG. 25 is a graph showing OFF-state currents obtained from the device simulation.

FIG. 24 shows change of off-current with respect to the donor concentration when the gate voltage is −20 V and the drain voltage Vd is 1 V, depending on the distance d of the pair of microcrystalline silicon layers μc-Si(n) in which phosphorus is added. FIG. 25 shows change of off-current with respect to the donor concentration when the gate voltage is −20 V and the drain voltage Vd is 10 V, depending on the distance d of the pair of microcrystalline silicon layers μc-Si(n) in which phosphorus is added.

Figure 26:
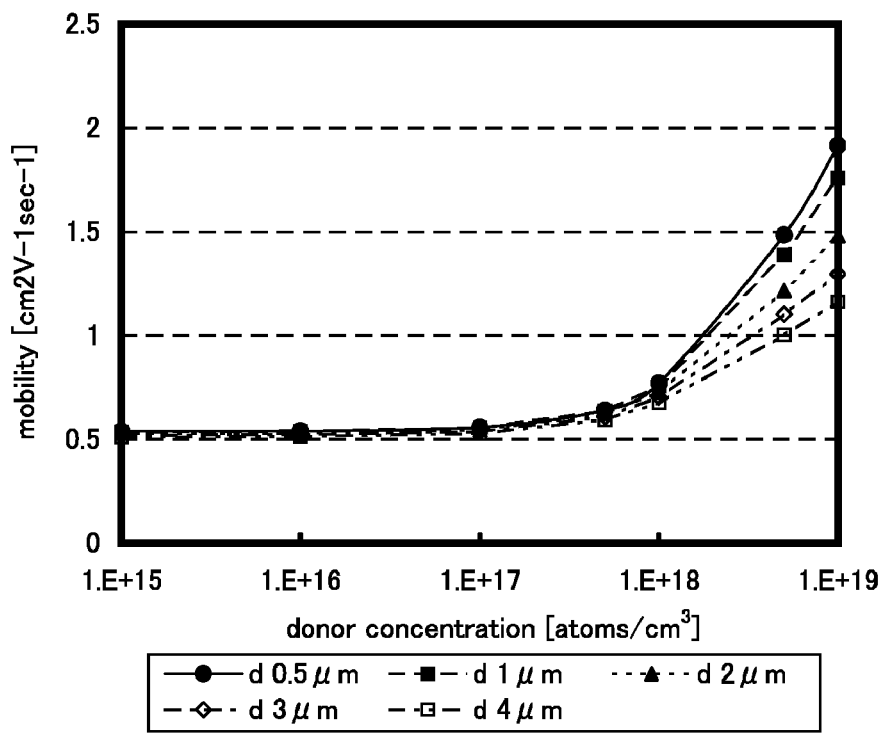
FIG. 26 is a graph showing field-effect mobilities obtained from the device simulation.
Figure 27:
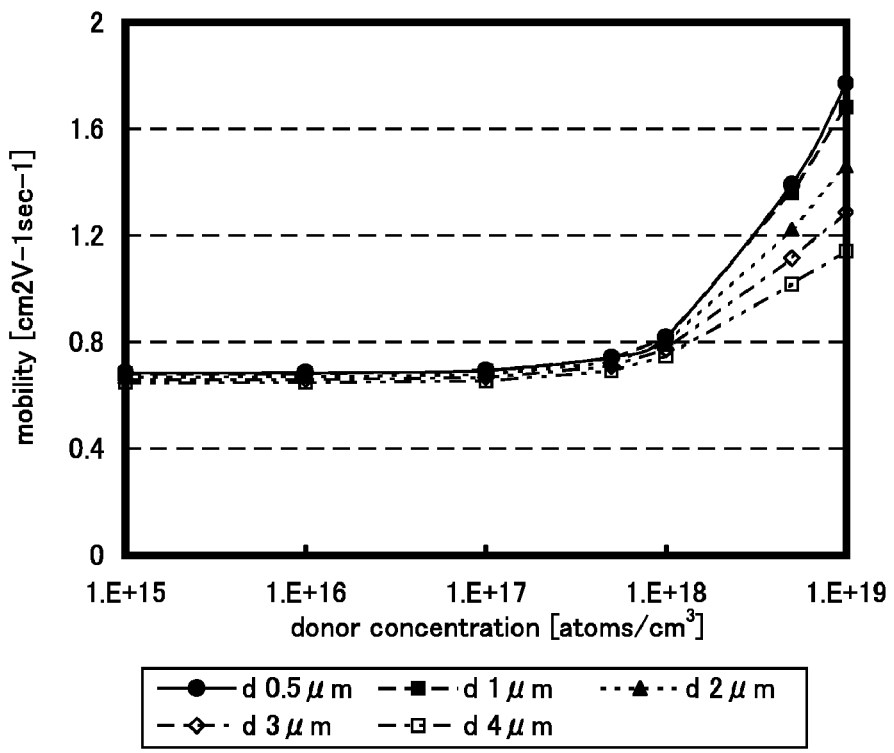
FIG. 27 is a graph showing field-effect mobilities obtained from the device simulation.

FIG. 26 shows change of field-effect mobility with respect to the donor concentration when the drain voltage Vd is 1 V, depending on the distance d of the pair of microcrystalline silicon layers μc-Si(n) in which phosphorus is added. FIG. 27 shows change of field-effect mobility with respect to the donor concentration when the drain voltage Vd is 10 V, depending on the distance d of the pair of microcrystalline silicon layers μc-Si(n) in which phosphorus is added.

For a thin-film transistor which can be used in a display device, the following condition is needed to be satisfied: on-state current is equal to or greater than $5 \times 10^{-7}$ A when the drain voltage Vd is 10 V and is equal to or greater than $5 \times 10^{-6}$ A when the drain voltage Vd is 1 V. From the graphs shown in FIGS. 22 and 23, the donor concentration satisfying this condition is $5 \times 10^{18}$ to $1 \times 10^{19}$ atoms/cm$^3$ when the distance d is 0.5 to 4 μm.

Further, the following condition is needed to be satisfied: off-state current is equal to or less than $1 \times 10^{-9}$ A when the drain voltage Vd is 10 V and is equal to or less than $1 \times 10^{-10}$ A when the drain voltage Vd is 1 V. From the graphs shown in FIGS. 24 and 25, the donor concentration satisfying this condition is $1 \times 10^{17}$ to $1 \times 10^{19}$ atoms/cm$^3$ when the distance d is 0.5 to 4 μm.

Further, the donor concentration where the field-effect mobility of 1 cm$^2$V-sec or more when the drain voltage Vd is 1 V is $5 \times 10^{18}$ to $1 \times 10^{19}$ atoms/cm$^3$ when the distance d is 0.5 to 4 μm from the graph shown in FIG. 26.

Accordingly, it is preferable that the donor concentration be in the range of $5 \times 10^{18}$ to $1 \times 10^{19}$ atoms/cm$^3$ when the distance d is 0.5 to 4 μm.

When the donor concentration is $5 \times 10^{18}$ to $1 \times 10^{19}$ atoms/cm$^3$, the electrical conductivity is 0.9 to 2 S/cm when the donor activation rate is 100%. The concentration of the impurity element serving as a donor, satisfying these electrical conductivities when the activation rate of the donor is 5 to 100% is $5 \times 10^{18}$ to $2 \times 10^{20}$ atoms/cm$^3$.

The present application is based on Japanese Patent Application serial No. 2008-051426 filed with Japan Patent Office on Feb. 29, 2008, the entire contents of which are hereby incorporated by reference.

What is claimed is:

1. A thin-film transistor comprising:
   a gate electrode;
   a gate insulating layer over the gate electrode;
   a pair of conductive layers over the gate insulating layer, wherein the pair of conductive layers overlaps the gate electrode at least partly and is disposed with a space therebetween in a channel length direction;
   a pair of impurity semiconductor layers over the pair of conductive layers and the gate electrode, wherein an impurity element imparting one conductivity type is added to the pair of impurity semiconductor layers to form a source region and a drain region; and
   an amorphous semiconductor layer over the pair of conductive layers, wherein the amorphous semiconductor layer is in contact with at least a part of the gate insulating layer, which is between the pair of conductive layers, and disposed between the pair of impurity semiconductor layers and the pair of conductive layers.

2. The thin-film transistor according to claim 1, wherein an electrical conductivity of each of the pair of conductive layers is 0.9 to 2 S/cm.

3. The thin-film transistor according to claim 1, wherein each of the pair of conductive layers is a metal layer, a metal nitride layer, a metal carbide layer, a metal boride layer, or a metal silicide layer.

4. The thin-film transistor according to claim 1, wherein each of the pair of conductive layers is a semiconductor layer in which an impurity serving as a donor is added.

5. The thin-film transistor according to claim 4, wherein a donor concentration of each of the pair of conductive layers is equal to or greater than $5 \times 10^{18}$ atoms/cm$^3$ and equal to or less than $2 \times 10^{20}$ atoms/cm$^3$.

6. The thin-film transistor according to claim 1, wherein the pair of conductive layers is a microcrystalline silicon layer.

7. The thin-film transistor according to claim 1, wherein the amorphous semiconductor layer is an amorphous silicon layer.

8. A display device, wherein the thin film transistor according to claim 1 is provided in each pixel of a pixel portion.

9. A thin-film transistor comprising:
   a gate electrode;
   a gate insulating layer over the gate electrode;
   a pair of conductive layers over the gate insulating layer, wherein the pair of conductive layers overlaps the gate electrode at least partly and is disposed with a space therebetween in a channel length direction;
   a pair of buffer layers over the pair of conductive layers;
   a pair of impurity semiconductor layers over the pair of conductive layers and the gate electrode, wherein an impurity element imparting one conductivity type is added to the pair of impurity semiconductor layers to form a source region and a drain region; and
   an amorphous semiconductor layer over the pair of conductive layers, wherein the amorphous semiconductor layer is in contact with at least a part of the gate insulating layer, which is between the pair of conductive layers, and disposed between the pair of impurity semiconductor layers and the pair of conductive layers.

10. The thin-film transistor according to claim 9, wherein an electrical conductivity of each of the pair of conductive layers is 0.9 to 2 S/cm.

11. The thin-film transistor according to claim 9, wherein each of the pair of conductive layers is a metal layer, a metal nitride layer, a metal carbide layer, a metal boride layer, or a metal silicide layer.

12. The thin-film transistor according to claim 9, wherein each of the pair of conductive layers is a semiconductor layer in which in impurity serving as a donor is added.

13. The thin-film transistor according to claim 12, wherein a donor concentration of each of the pair of conductive layers is equal to or greater than $5\times10^8$ atoms/cm$^3$ and equal to or less than $2\times10^{20}$ atoms/cm$^3$.

14. The thin-film transistor according to claim 9, wherein the pair of conductive layers is a microcrystalline silicon layer.

15. The thin-film transistor according to claim 9, wherein the amorphous semiconductor layer is an amorphous silicon layer.

16. A display device, wherein the thin-film transistor according to claim 9 is provided in each pixel of a pixel portion.

17. The thin-film transistor according to claim 9, wherein the pair of buffer layers is an amorphous semiconductor layer.

18. A thin-film transistor comprising:
a gate electrode;
a gate insulating layer over the gate electrode;
a pair of conductive layers over the gate insulating layer, wherein the pair of conductive layers overlaps the gate electrode at least partly and is disposed with a space therebetween in a channel length direction;
a pair of impurity semiconductor layers over the pair of conductive layers and the gate electrode, wherein an impurity element imparting one conductivity type is added to the pair of impurity semiconductor layers to form a source region and a drain region; and
an amorphous semiconductor layer over the pair of conductive layers, wherein the amorphous semiconductor layer is in contact with at least a part of the gate insulating layer, which is between the pair of conductive layers, and disposed between the pair of impurity semiconductor layers and the pair of conductive layers,
wherein a space between the pair of impurity semiconductor layers is larger than the space of the pair of conductive layers.

19. The thin-film transistor according to claim 18, wherein an electrical conductivity of the pair of conductive layers is 0.9 to 2 S/cm.

20. The thin-film transistor according to claim 18, wherein each of the pair of conductive layers is a metal layer, a metal nitride layer, a metal carbide layer, a metal boride layer, or a metal silicide layer.

21. The thin-film transistor according to claim 18, wherein each of the pair of conductive layers is a semiconductor layer in which in impurity serving as a donor is added.

22. The thin-film transistor according to claim 21, wherein the donor concentration of each of the pair of conductive layers is equal to or greater than $5\times10^8$ atoms/cm$^3$ and equal to or less than $2\times10^{20}$ atoms/cm$^3$.

23. The thin-film transistor according to claim 21, wherein a donor concentration of each of the pair of conductive layers is equal to or greater than $5\times10^{18}$ atoms/cm$^3$ and equal to or less than $2\times10^{20}$ atoms/cm$^3$.

24. The thin-film transistor according to claim 18, wherein the amorphous semiconductor layer is an amorphous silicon layer.

25. A display device, wherein the thin-film transistor according to claim 18 is provided in each pixel of a pixel portion.

* * * * *

UNITED STATES PATENT AND TRADEMARK OFFICE
CERTIFICATE OF CORRECTION

PATENT NO. : 7,786,485 B2
APPLICATION NO. : 12/390144
DATED : August 31, 2010
INVENTOR(S) : Koji Dairiki et al.

It is certified that error appears in the above-identified patent and that said Letters Patent is hereby corrected as shown below:

Title page item (73), Assignee: "Semicondutor" should read "Semiconductor"

Title page item (57), Abstract, line 7, "layers" should read "layer,"

column 7, line 38, "silicon, that is," should read "silicon. That is,"

column 9, line 47, "1100 nm x 1250 mm" should read "1100 mm x 1250 mm"

column 11, line 57, "Tr01a" should read "Tr01,"

column 13, line 28, "formed, therefore," should read "formed. Therefore,"

column 16, line 7, "he" should read "be"

column 17, line 1, "gale" should read "gate"

column 20, line 52, "clement" should read "element"

column 24, line 60, "alone" should read "along"

column 31, line 47, "101" should read "1101"

column 32, line 50, "a-Si(n$^-$)" should read "a-Si(n$^+$)"

column 33, line 49, "V-sec" should read "V·sec"

column 35, claim 13, line 3, "5 x 10$^8$" should read "5 x 10$^{18}$"

column 36, claim 23, should read as follows:

"23. The thin-film transistor according to claim 18, wherein the pair of conductive layers is a microcrystalline silicon layer."

Signed and Sealed this
Eleventh Day of January, 2011

David J. Kappos
*Director of the United States Patent and Trademark Office*